(12) United States Patent
Nakai et al.

(10) Patent No.: US 6,529,418 B2
(45) Date of Patent: Mar. 4, 2003

(54) NON-VOLATILE SEMICONDUCTOR MEMORY DEVICE CONDUCTING DATA WRITE AND ERASE OPERATIONS BASED ON A PRESCRIBED UNIT REGION

(75) Inventors: Hiroaki Nakai, Hyogo (JP); Satoshi Tatsukawa, Hyogo (JP); Kei Maejima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/960,496

(22) Filed: Sep. 24, 2001

(65) Prior Publication Data

US 2002/0141236 A1 Oct. 3, 2002

(30) Foreign Application Priority Data

Mar. 28, 2001 (JP) ........................................ 2001-091734

(51) Int. Cl.[7] ............................................. G11C 16/04
(52) U.S. Cl. ............................ 365/185.33; 365/189.04; 365/189.01
(58) Field of Search ..................... 365/185.33, 189.04, 365/189.01, 189.07, 185.24, 230.01, 230.08

(56) References Cited

U.S. PATENT DOCUMENTS 5,592,427 A * 1/1997 Kumakura et al. ............ 327/51
6,067,598 A * 5/2000 Roohparvar et al. ... 365/185.33
6,226,198 B1 * 5/2001 Miwa et al. ........... 365/185.03
6,272,586 B1 * 8/2001 Roohparvar et al. ... 365/185.01

FOREIGN PATENT DOCUMENTS

JP 10-334073 12/1998
JP 2000-113686 4/2000

* cited by examiner

*Primary Examiner*—David Nelms
*Assistant Examiner*—Thong Le
(74) *Attorney, Agent, or Firm*—McDermott, Will & Emery

(57) ABSTRACT

A normal array for storing data in a non-volatile manner is divided into m sectors each corresponding to a unit subjected to a single data write or erase operation (where m is a natural number). An extra memory array includes a plurality of extra sectors each corresponding to a unit subjected to a single data read operation. The number of extra sectors is equal to or smaller than m. Each extra sector stores the data of the data write conditions or erase conditions corresponding to one of the m sectors in a non-volatile manner. The data write operation or erase operation is conducted based on the information corresponding to a selected sector, which is read from the extra memory array.

18 Claims, 23 Drawing Sheets

| | | INPUT WRITE COMMAND | | — S100 |
| | | INPUT SECTOR ADDRESS (FS1) | | — S110 |
| | | INPUT WRITE DATA | | — S120 |
| | | INPUT CONFIRM COMMAND | | — S130 |
| | | READ WRITE CONDITION INFORMATION PD FROM EXTRA SECTOR (ES1) CORRESPONDING TO SELECTED SECTOR (FS1) | | — S140 |
| | | WRITE DATA TO SELECTED SECTOR BASED ON WRITE CONDITION INFORMATION PD | | — S150 |
| | | COMPLETE SINGLE DATA WRITE OPERATION | | — S200 |

| Vpgm1 | Vpgm2 | Vpgm3 | P(1) | P(0) |
|---|---|---|---|---|
| V1s(17.0v) | V2s(16.0v) | V3s(15.0v) | 0 | 0 |
| V1h(17.5v) | V2h(16.5v) | V3h(15.5v) | 0 | 1 |
| V1l(16.5v) | V2l(15.5v) | V3l(14.5v) | 1 | 0 |

PD covers P(1), P(0)

| NL1 | r2 | r3 | PD | | |
|---|---|---|---|---|---|
| | | | P(1) | P(0) | |
| NORMAL RANGE | r2s | r3s | 0 | 0 | ← STANDARD |
| LARGER THAN NORMAL | r2h(>r2s) | r3h(>r3s) | 0 | 1 | ← LOWER WRITE SPEED |
| SMALLER THAN NORMAL | r2l(<r2s) | r3l(<r3s) | 1 | 0 | ← HIGHER WRITE SPEED |

| NL1 | ΔV2 | ΔV3 | PD | | |
|---|---|---|---|---|---|
| | | | P(1) | P(0) | |
| NORMAL RANGE | ΔV2s | ΔV3s | 0 | 0 | ← STANDARD |
| LARGER THAN NORMAL | ΔV2h(>ΔV2s) | ΔV3h(>ΔV2s) | 0 | 1 | ← LOWER WRITE SPEED |
| SMALLER THAN NORMAL | ΔV2l(<ΔV2s) | ΔV3l(<ΔV2s) | 1 | 0 | ← HIGHER WRITE SPEED |

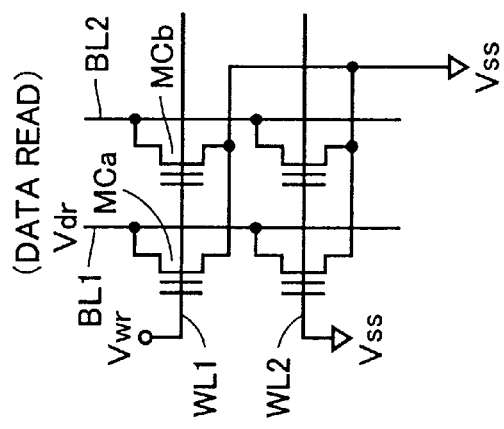
FIG.23C PRIOR ART (DATA READ)
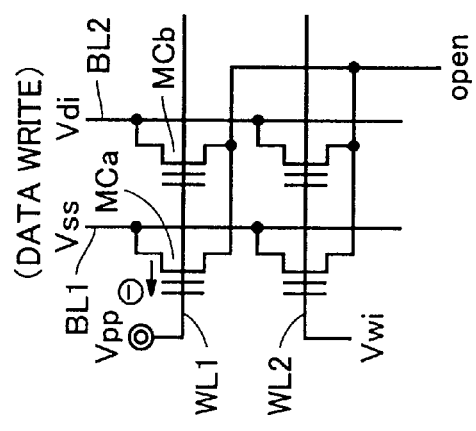
FIG.23B PRIOR ART (DATA WRITE)
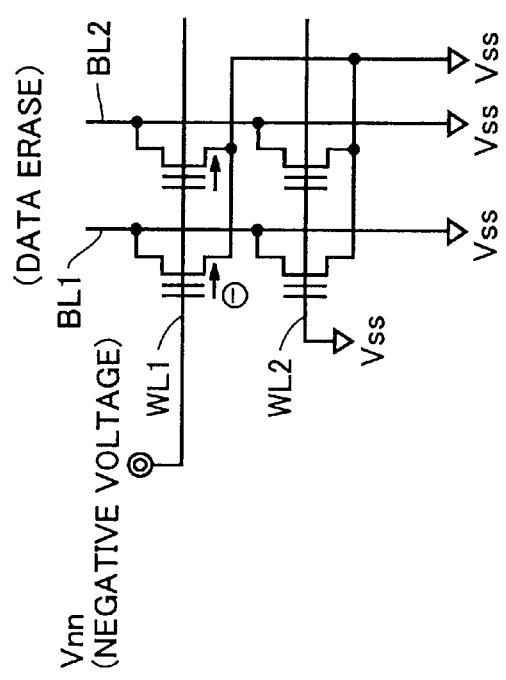
FIG.23A PRIOR ART (DATA ERASE)

NON-VOLATILE SEMICONDUCTOR MEMORY DEVICE CONDUCTING DATA WRITE AND ERASE OPERATIONS BASED ON A PRESCRIBED UNIT REGION

BACKGROUND OF THE INVENTION

1. Field of the Invention

The present invention generally relates to a non-volatile semiconductor memory device. More particularly, the present invention relates to a non-volatile semiconductor memory device conducting a data write or data erase operation based on a prescribed unit region.

2. Description of the Background Art

A flash memory is a typical example of electrically erasable non-volatile memories.

FIG. 22 is a conceptual diagram showing the memory cell structure of the flash memory.

Referring to FIG. 22, a memory cell MC of the flash memory includes a source 2 and a drain 3. The source 2 and the drain 3 are $n^+$ regions, and are formed at a p-type substrate 1. The memory cell MC further includes a floating gate 4 and a control gate 5. The floating gate 4 and the control gate 5 are deposited on the p-type substrate 1 so as to be insulated by an insulating film 6. In particular, an insulating film between the floating gate 4 and the control gate 5 is also referred to as an inter-poly insulating film 6a, and an insulating film between the floating gate 4 and the p-type substrate 1 is also referred to as a tunnel insulating film 6b. Thus, the memory cell MC corresponds to an n-channel field effect transistor formed on the p-type substrate 1.

The control gate 5 is coupled to a word line WL for selecting the memory cell MC. The source 2 and the drain 3 are respectively coupled to a source line SL and a bit line BL.

In the initial state, i.e., in the data erase state, electrons 7 are drawn out of the floating gate 4 of the memory cell MC.

In contrast, a data write operation to the memory cell MC is conducted by injection of the electrons 7 into the floating gate 4 by Fowler-Nordheim tunneling. The memory cell MC having the electrons 7 injected into the floating gate 4, i.e., in the data write state, has a higher threshold voltage than in the data erase state.

Accordingly, selectively writing the data to a part of the memory cell group in the data erase state enables the storage data to be read according to the threshold voltage value of each memory cell MC. The storage data is read in the following manner: with the bit line being precharged, a fixed voltage is applied to the word line WL connected to the control gate so as to cause memory discharge for a prescribed period, and then a potential on the bit line is detected.

FIGS. 23A to 23C are conceptual diagrams illustrating data erase, write and read operations of the flash memory.

Note that FIGS. 23A to 23C illustrate the respective operations to and from a memory cell group arranged in two rows by two columns. Word lines WL1 and WL2 are provided corresponding to the respective memory cell rows, and bit lines BL1 and BL2 are provided corresponding to the respective memory cell columns. The source line SL is provided in common to the memory cells.

In the specification, a prescribed unit region that is subjected to a single data write operation or data erase operation is referred to as a "sector". A single sector herein corresponds to a memory cell group selected by a single word line.

Referring to FIG. 23A, the data erase operation is conducted on a sector-by-sector basis. The word line WL1 of the selected sector is set to a negative high voltage Vnn, as well as the source line SL and the bit lines BL1, BL2 are grounded. The word line WL2 of the non-selected sector is grounded.

As a result, the negative high voltage Vnn and the ground voltage Vss are respectively applied to the control gates and sources of the memory cells of the selected sector. Thus, in each memory cell of the selected sector, electrons are drawn out of the floating gate by the Fowler-Nordheim tunneling, whereby the data is erased.

Referring to FIG. 23B, the data write operation is conducted on a sector-by-sector basis. The word line WL1 of the selected sector is set to a high voltage Vpp with the source line SL being opened.

According to the write data, a write inhibit voltage Vdi and a ground voltage Vss are selectively applied to each bit line. In a memory cell receiving the high voltage Vpp and the ground voltage Vss at its control gate and drain through the word line and the bit line, respectively, electrons are injected into the floating gate by the Fowler-Nordheim tunneling, whereby the data is written thereto. However, the data is not written to a memory cell receiving the high voltage Vpp and the write inhibit voltage Vdi at its control gate and drain, respectively.

In order to prevent drain disturb, a voltage Vwi having about the same value as that of the write inhibit voltage Vdi is applied to the word line WL2 of the non-selected sector.

Thus, controlling the respective drain voltages of the plurality of memory cells coupled to the same word line WL through the bit lines allows for the selective data write operation.

For example, in FIG. 23B, the word line WL1 is selected to be driven to the high voltage Vpp. In response to this, the data is written to a memory cell MCa coupled to the bit line BL1 of the ground voltage Vss. However, the data is not written to a memory cell MCb coupled to the bit line BL2 of the write inhibit voltage Vdi.

Thus, by first erasing the data from each memory cell MC and then selectively writing the data thereto, only the threshold voltage of the written memory cell is increased.

Referring to FIG. 23C, in the data read operation, each bit line is precharged to a prescribed voltage Vdr. Then, a prescribed data read voltage Vwr is applied to the selected word line for a prescribed period. Thus, the control gates of the corresponding memory cells are set to the prescribed voltage Vwr. The word line WL2 of the non-selected sector is retained at the ground voltage Vss.

By appropriately setting the voltages Vwr, Vdr in view of the threshold voltage of the written memory cell, the charges precharged in the written memory cell are stored therein. However, the charges precharged in the non-written memory cell are discharged therefrom. Accordingly, the data can be read by detecting the amount of charges remaining on the bit line.

Thus, depending on whether the electrons are injected into the floating gate or not, the data can be written to each memory cell MC in a non-volatile manner as well as the storage data thereof can be read.

FIG. 24 is a conceptual diagram showing the threshold voltage distribution of the memory cells of the flash memory.

Referring to FIG. 24, a memory cell in the data write state, i.e., having the storage data level of "0", has a higher threshold voltage than that of a memory cell in the data erase state, i.e., having the storage data level of "1".

In each state, the memory cell group has a variation in threshold voltage distribution. Therefore, in view of this variation, a data read level Vtr is set so that the respective threshold voltages can be distinguished from each other. Thus, the data can be read from the memory cell.

In other words, in the data read operation, prescribed applied voltages to the memory cells, i.e., Vwr and Vdr in FIG. 23C, are set so that a current flows through a transistor whose threshold voltage corresponds to the data read level Vtr.

Recently, so-called multi-level technology capable of writing a plurality of data levels to each memory cell has been used for reduced costs and increased capacity of the flash memory. For example, in a 2 bits/cell flash memory, two-bit information is stored in a single memory cell.

FIG. 25 is a conceptual diagram showing the threshold voltage distribution of the memory cells of the 2 bits/cell flash memory.

Referring to FIG. 25, in the 2 bits/cell flash memory, three data write states L1, L2 and L3 are defined in addition to the data erase state corresponding to the storage data level of "11". For example, the data write states L1, L2 and L3 respectively correspond to the storage data levels of "00", "01" and "10".

Appropriately setting the data write conditions such as an applied voltage level in the data write operation (the high voltage Vpp in FIG. 23B) makes the threshold voltage distributions of the data write states of the respective data levels different from each other.

Data read levels Vtr1 to Vtr3 are set at the respective boundaries of the threshold voltage distributions of the data write states of the three data levels. Accordingly, a memory cell storing such multi-level data must have tighter threshold voltage distributions. In other words, variation must be suppressed in the data write state of each data level.

The difference in data write characteristics between the memory cells resulting from the manufacturing variation is problematic in terms of suppressing the variation in threshold voltage in each data write state. For example, the variation results from the difference in wiring width of the control gate, i.e., the word line, thickness of the inter-poly insulating film between the control gate and the floating gate, thickness of the tunnel insulating film between the semiconductor substrate and the floating gate, and the like.

For example, a memory cell having a narrower word line and thicker insulating film and tunnel insulating film is less susceptible to electron injection for a data write operation. Therefore, setting the standard data write conditions adapted to the standard data write characteristics would increase the time required for writing.

In contrast, a memory cell having a wider word line and thinner inter-poly insulating film and tunnel insulating film is more susceptible to electron injection, whereby the data is written at a high speed. Accordingly, when the data is written on the standard data write conditions, an increased number of memory cells are slightly over-programmed with the electrons excessively injected therein, resulting in a variation in threshold voltage after the data write operation.

Accordingly, in the flash memory, it is desirable to adjust the data write conditions based on a unit write region that is subjected to a single data write operation, i.e., on a sector-by-sector basis. For example, in the operation testing, optimal data write conditions of every sector are calculated and stored in the memory device. In the normal operation, the optimal data write conditions corresponding to the sector of interest are read upon every write operation, so that the data is written based on the optimal data write conditions.

In general, when the data is written to the flash memory, a data write pulse, i.e., a voltage signal having a prescribed voltage amplitude and pulse width, is applied to the control gate. In other words, the data write conditions are set according to the voltage amplitude and pulse width of the data write pulse.

Japanese Laid-Open Publication No. 10-334073 discloses the technology of pre-storing the write condition information of a flash memory incorporated into a microcomputer, by using a partial region of a memory cell array of the flash memory. When the data is written to a memory cell in a normal region, the pre-stored write condition information is read in order to set the write conditions, i.e., the voltage level and pulse width of the data write pulse, based on the information.

FIG. 26 is a schematic block diagram showing the overall structure of a flash memory of the conventional example having setting of the data write conditions of each sector pre-stored therein.

Referring to FIG. 26, the flash memory 8 of the conventional example includes a memory array 10, a row decoder 20, a column decoder 30, a column selection gate and sense amplifier 35, a data register and data write circuit 40.

The memory array 10 has a plurality of memory cells arranged in a matrix. Each memory cell has the structure shown in FIG. 22.

The memory array 10 has a normal region 12 for normal data storage, and a write condition storage region 14 for storing the data write conditions in writing the data to the normal region 12.

The normal region 12 is divided into a plurality of sectors. In the structure of FIG. 26, a memory cell group of the same row coupled to the same word line WL forms the same sector. In other words, each sector has a plurality of memory cells that are subjected to a single data read operation and a single data write operation.

In the flash memory 8, the data write operations are set on a sector-by-sector basis so as to appropriately conduct the data write operation. The structure of the write condition storage region 14 will be specifically described later.

The row decoder 20 receives a sector address SA, and selects a sector by selective activation of the word line according to the sector address SA.

The column decoder 30 conducts column selection according to a column address CA. In the data read operation, the column selection gate and sense amplifier 35 outputs the read data according to a voltage on the bit line corresponding to the memory cell column selected by the column decoder 30.

The data register and data write circuit 40 stores the write data to the sector of interest, and also sets the respective voltages of the bit lines BL according to the stored write data.

The flash memory 8 further includes a control signal buffer 50, a multiplexer 52, a sector address buffer 54, a command decoder 56, a column address counter 58, a control circuit 60, and a data input buffer 65.

The control signal buffer 50 receives an external control signal for generating an internal control signal and a multiplexer control signal. The multiplexer control signal switches input/output to/from multiplexer 52. For example, at an input of command, the external control signal corresponding to the input command is input to the control signal buffer 50. The multiplexer 52 transmits a signal (i.e. command) from the external input/output (I/O) to the command decoder 56 in response to the multiplexer control signal based on the input external control signal. The control circuit 60 receives the internal control signal to perform predetermined operations, e.g. data read operation, data write operation, and data erase operation corresponding to the output of command decoder 56.

In the data read operation, an address signal is input from the external I/O after a read command. The external control signal corresponding to the read command is input to the control signal buffer 50. The multiplexer 52 transmits the address signal from the external I/O to the sector address buffer 54 in response to the multiplexer control signal based on the input external control signal. The control circuit 60 receives the internal control signal and controls column-related circuits (e.g. the column decoder 30, column selection gate and sense amplifier 35, and data register and data write circuit 40) to perform predetermined read operation with selecting the sector corresponding to the input address signal. Furthermore, an external control signal for outputting read data is input to the control signal buffer 50. The multiplexer 52 transmits the read data from the data output buffer 75 to the external I/O, in response to the multiplexer control signal based on the input external control signal.

In the data write operation, an address signal is input from the external I/O after a write command. The external control signal corresponding to the write command is input to the control signal buffer 50. The multiplexer 52 transmits the address signal from the external I/O to the sector address buffer 54 in response to the multiplexer control signal based on the input external control signal. Next, each write data is set to the data register and data write circuit 40 through column selection gate and sense amplifier 35. At this timing, an external control signal to transmit write data from the external I/O to the data input buffer 65 is input to the control signal buffer 50. The multiplexer 52 transmits the write data to the data input buffer 65 in response to the multiplexer control signal based on the input external control signal. The column address counter 58 conducts a count-up operation to sequentially address a plurality of memory cell columns and transmits a column address CA to the column decoder 30. Write data sequentially input from the external I/O are set to the data register and data write circuit 40 according to the counted-up column addresses.

Next to the write command, a confirm command is input from the external I/O. The external control signal corresponding to the confirm command is input to the control signal buffer 50. The multiplexer 52 transmits a signal (i.e. confirm command) from the external I/O to the command decoder 56 in response to the multiplexer control signal based on the input external control signal. The control circuit 60 starts a data write operation in response to the output of the command decoder 56 and the internal command signal. In the data write operation, a data write pulse is applied to each of the memory cells included in the selected sector by the address signal.

In the data write operation, the control circuit 60 gives an instruction to the row decoder 20 on the application timing of the data write pulse to the word line and the pulse width thereof.

The flash memory 8 further includes a selector 70, a data output buffer 75, a high-voltage generating circuit 80, and a write condition information register 85.

The selector 70 transmits the read data from the column selection gate and sense amplifier 35 to either the data output buffer 75 or the write condition information register 85. The data read from the normal region 12 is transmitted from the selector 70 to the data output buffer 75, and is output as read data to the external I/O through the multiplexer 52. The data read from the write condition storage region 14 is transmitted to the write condition information register 85, and held therein.

The high-voltage generating circuit 80 produces a program voltage Vpgm according to the data retained in the write condition information register 85.

In the data write operation, the row decoder 20 applies a data write pulse to the word line WL corresponding to the sector address SA, based on the timing and pulse width designated by the control circuit 60. The voltage amplitude of the data write pulse corresponds to the program voltage Vpgm produced by the high-voltage generating circuit 80.

With such a structure, the write condition storage region 14 formed from a part of the memory array 10 stores pre-adjusted data write conditions of every sector. In the normal operation, optimal data write conditions corresponding to the sector of interest are read upon every write operation, so that the data can be written based on the optimal data write conditions.

In FIG. 26, the write condition storage region 14 is formed from the memory cells arranged on the same memory array 10 as that of the memory cells of the normal region 12. Such a structure causes the following problems.

FIGS. 27A to 27C are conceptual diagrams illustrating the problems regarding the arrangement of the write condition storage region.

It is now assumed that the normal region 12 of the memory array 10 is formed from 16 k word lines, i.e., 16 k sectors, and has 2 k memory cell columns (bit lines).

In the structure of FIG. 27A, the write condition storage region 14 has independent sectors respectively corresponding to the sectors of the normal region 12. These sectors are arranged in the same manner as that of the sectors of the normal region 12. In this case, the data write conditions suitable for each sector of the normal region 12 can be stored in the respective sector of the write condition storage region 14.

In the structure of FIG. 27A, however, the write condition storage region 14 also includes in every sector a memory cell group for storing 2 k-bit data. On the other hand, the data write conditions suitable for each sector are generally set in the following manner: for example, a suitable setting level of the voltage amplitude and pulse width of the data write pulse or the like is selected from at most about several setting levels, based on the data write performance of the sector of interest.

The data for selecting such a setting level can be stored with a small number of bits. Therefore, providing the memory cells corresponding to 2 k bits is extremely wasteful. Referring to FIG. 27A, the data write conditions can be stored in a small region 14a of the write condition storage region 14. The remaining region 14b of the write condition storage region 14 is wasted in terms of the layout. This unnecessarily increases the area of the memory array 10.

In the structure of FIG. 27B, the write condition storage region 14 corresponds only to the region 14a of FIG. 27A. Accordingly, other circuitry can be provided using a region corresponding to the region 14b of FIG. 27A, thereby reducing the limitations on the layout.

However, the structure of FIG. 27B includes the memory cell columns corresponding to both the normal region 12 and the write condition storage region 14, and the memory cell columns corresponding only to the normal region 12, resulting in the difference in bit length between the memory cell columns. Therefore, the bit line load is different from memory cell column to memory cell column, making it difficult to stabilize the operation.

In the structure of FIG. 27C, the normal region 12 is extended in the column direction for the write condition storage region 14. Such a structure can suppress the area penalty.

In the structure of FIG. 27C, however, both the normal region 12 and the write condition storage region 14 are selected by a common word line. Therefore, upon erasing the data stored in the normal region 12, the data write conditions stored in the write condition storage region 14 may also be erased.

Therefore, the data write conditions stored in the write condition storage region 14 must be saved to a register or the like before erasing the data from the normal region 12, and written back to the write condition storage region 14 after completion of the erasing. This increases the time required for the data erase operation.

Accordingly, it is possible to form the write condition storage region 14 from the sectors independent of those of the normal region 12 as shown in FIG. 26 and to store the data write conditions corresponding to a plurality of sectors of the normal region 12 in a single sector of the write condition storage region 14.

FIG. 28 is a conceptual diagram showing the structure of the write condition storage region 14 of FIG. 26.

Referring to FIG. 28, the data write conditions of each sector of the normal region 12 are represented by 2-bit data. This enables the data write conditions to be set in $2^2=4$ levels in the data write operation to each sector.

Accordingly, the data write conditions corresponding to 1 k sectors of the normal region 12 can be stored in a single sector of the write condition storage region 14. For example, the respective data write conditions corresponding to the first (#1) to $1024^{th}$ (#1024) sectors of the normal region 12 can be stored in the first sector ES1 of the write condition storage region 14.

Thus, the write condition storage region 14 can store the respective data write conditions corresponding to 16 k sectors of the normal region 12 in the memory cells of 16 word lines by 2 k bit lines. As a result, the area of the write condition storage region 14 can be reduced without causing the problems described in connection with FIGS. 27A to 27C.

However, the structure of FIG. 28 is problematic in that the read disturb to the memory cells of the write condition storage region 14 occurs when the data is sequentially written to a plurality of successive sectors.

The read disturb results from an electric field applied between the control gate and the substrate in the data read operation. Moreover, a voltage, although being lower than the data write voltage, is applied between the gate and drain of the memory cell in the data read operation. This may possibly results in the soft write, a phenomenon that the data is erroneously written to the memory cell in the erase state.

For example, it is now assumed that the data is successively written to the first (#1) to $1024^{th}$ (#1024) sectors of the normal region 12. In this case, the data is repeatedly read from the sector ES1 of the write condition storage region 14 every time the data is written to the sector of the normal region 12.

Every time the data is read from the sector ES1, each of the 2 k memory cells in the sector ES1 is subjected to the read disturb. Accordingly, the storage data in these memory cells may possibly be damaged.

Such a phenomenon may possibly cause erroneous selection of the data write conditions of the sectors upon writing the data to the normal region 12, thereby hindering a normal data write operation.

SUMMARY OF THE INVENTION

It is an object of the present invention to appropriately set the data write conditions or data erase conditions of each unit region that is subjected to a single write operation in a non-volatile semiconductor memory device like a flash memory.

It is another object of the present invention to appropriately set the write conditions for writing a respective level, in a multi-level storage non-volatile semiconductor memory device to which a plurality of data levels can be written.

In summary, a non-volatile semiconductor memory device according to the present invention includes a first memory array, an operation condition storage portion, an electric signal control portion, and a selecting portion. The first memory array stores data in a non-volatile manner. The first memory array is divided into a plurality of first unit regions each corresponding to a unit subjected to a single prescribed operation of writing or erasing data. The operation condition storage portion retains setting condition data of the prescribed operation to the first memory array. The operation condition storage portion includes a second memory array including a plurality of second unit regions each corresponding to a unit subjected to a single data read operation. Each of the second unit regions stores the setting condition data corresponding to one of the plurality of first unit regions in a non-volatile manner. The electric signal control portion determines, based on the setting condition data read from the operation condition storage portion, a setting condition of an electric signal for conducting the prescribed operation to a selected one of the plurality of first unit regions. The selecting portion supplies to the selected one of the first unit regions the electric signal according to the setting condition determined by the electric signal control portion.

Accordingly, a primary advantage of the present invention is that, even when the data is successively written to or erased from the first unit regions of the first memory array, the setting condition data corresponding to a selected first unit region can be read from the second memory array without repeatedly conducting a data read operation from the same second unit region. This enables the prescribed operation to be conducted on appropriate conditions on a sector-by-sector basis, and also prevents damages to the setting condition data stored in the second storage region. Moreover, since the second unit regions are arranged in the second memory array separately from the first unit regions, the size of the second memory array can be efficiently determined according to the content of the setting condition data.

According to another aspect of the present invention, a non-volatile semiconductor memory device includes a memory array, an electric signal control portion, and a selecting portion. The memory array includes a plurality of memory cells each being capable of storing a plurality of data levels in a non-volatile manner. The memory array is divided into a plurality of unit regions each corresponding to a unit subjected to a single data write operation. The electric signal control portion determines a setting condition of a plurality of electric signals for conducting a plurality of unit write operations corresponding to the plurality of data levels, respectively. The plurality of unit write operations form the single data write operation. The electric signal control portion sets the setting condition of each of the unit write operations except for an initial unit write operation thereof, according to a result of at least one of the unit write operations that have already been conducted in the same data write operation. The selecting portion supplies, in the plurality of unit write operations, the plurality of electric signals according to the setting condition determined by the electric signal control portion to a selected one of the plurality of unit regions.

Accordingly, in a single data write operation, the setting condition of the subsequent unit write operation except for the initial unit write operation can be appropriately determined based on the data write characteristics of the first unit region that are determined based on the result of the unit write operation that has already been conducted. As a result, the data write speed is increased as well as variation in characteristics after the data write operation can be suppressed in each of the first unit regions.

According to still another aspect of the present invention, a non-volatile semiconductor memory device includes a memory array, an electric signal control portion, and a selecting portion. The memory array includes a plurality of memory cells each being capable of storing a plurality of data levels in a non-volatile manner. The memory array is divided into a plurality of unit regions each corresponding to a unit subjected to a single data write operation. Each of the unit regions includes a management data region for storing a result of the data write operation conducted previously. The electric signal control portion determines a setting condition of a plurality of electric signals for conducting a plurality of unit write operations corresponding to said plurality of data levels, respectively, based on the result read from the management region. The plurality of unit write operations forms the single data write operation. The selecting portion supplies, in the plurality of unit write operations, the plurality of electric signals according to the setting condition determined by the electric signal control portion to a selected one of the plurality of unit regions.

Accordingly, the setting conditions of an initial one of the unit write operations can also be set optimally, with suppressing the variation in data write characteristics between the unit regions.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 23A to 23C are conceptual diagrams respectively illustrating the data erase, write and read operations of a flash memory.

DESCRIPTION OF THE PREFERRED EMBODIMENTS

Figure 1:
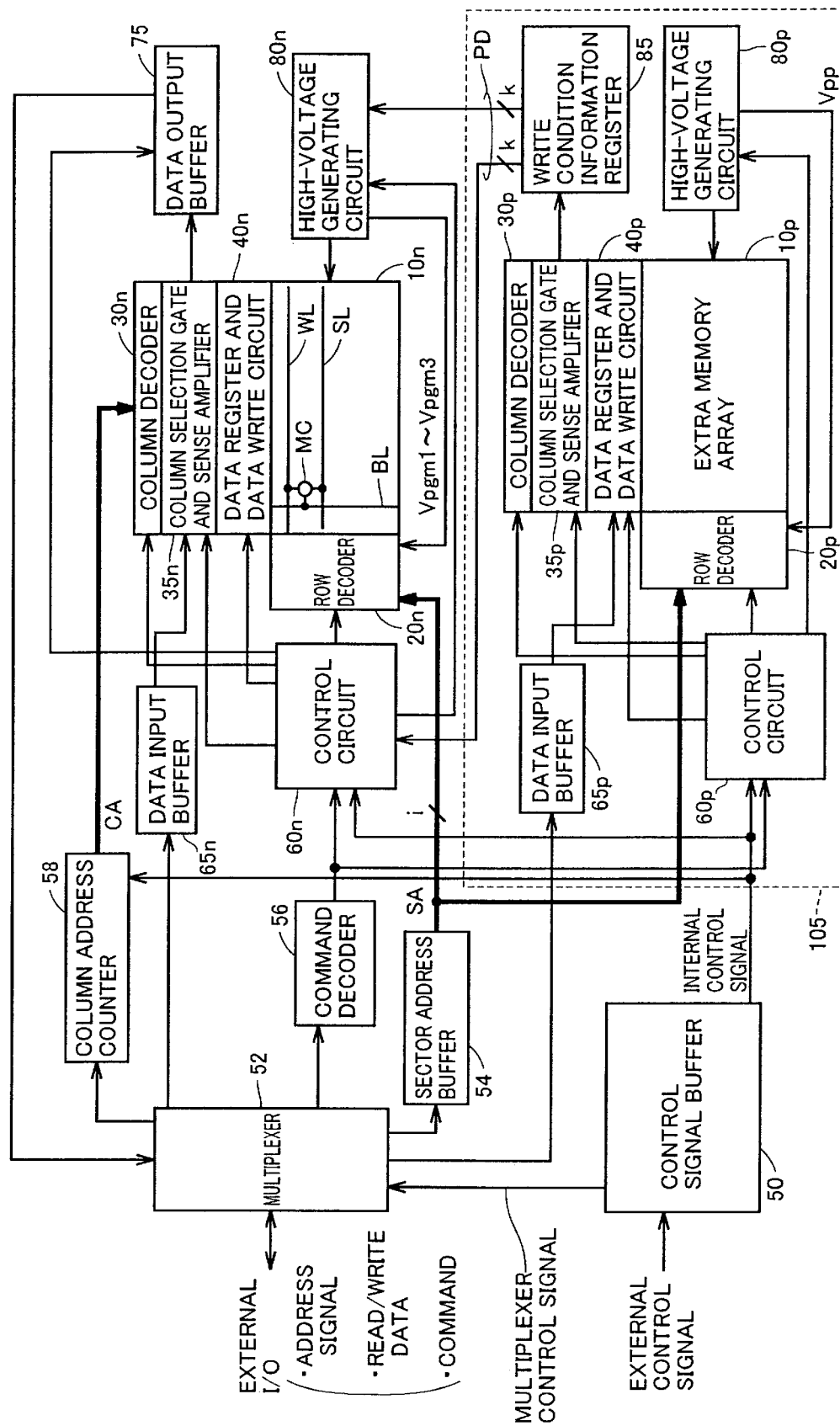
FIG. 1 is a schematic block diagram showing the overall structure of a flash memory as a typical example of a non-volatile semiconductor memory device according to a first embodiment of the present invention.

Hereinafter, embodiments of the present invention will be described in detail with reference to the accompanying drawings. Note that the same reference numerals and characters denote the same or corresponding portions throughout the figures.

First Embodiment

FIG. 1 shows a flash memory 100 as a typical example of a non-volatile semiconductor memory device according to the first embodiment of the present invention.

Note that FIG. 1 shows only a main part of the flash memory 100, which is associated with the data read and write operations. Circuitry for erasing the data is not entirely shown in the figure.

Referring to FIG. 1, the flash memory 100 includes a normal memory array 10n, a row decoder 20n, a column decoder 30n, a column selection gate and sense amplifier 35n, and a data register and data write circuit 40n.

Figure 22:
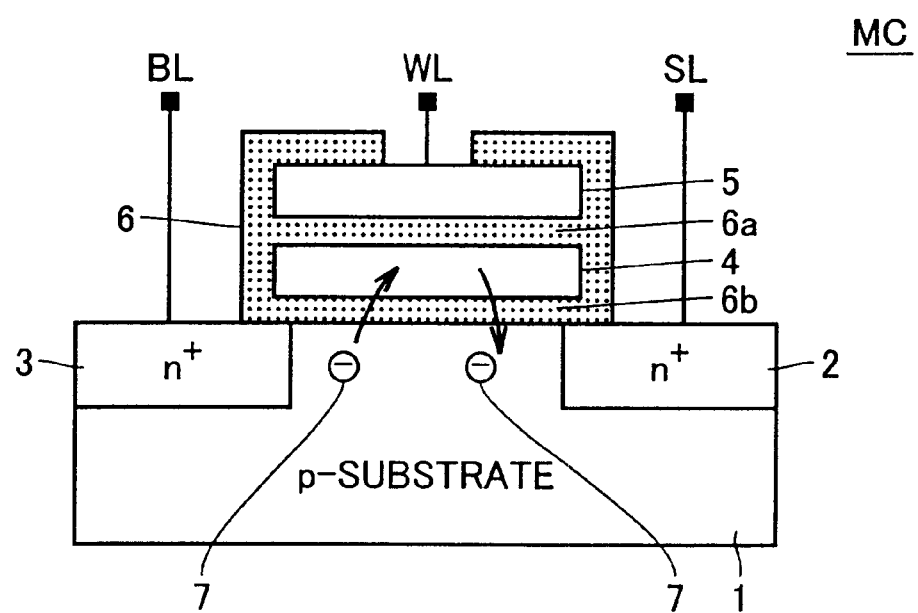
FIG. 22 is a conceptual diagram showing the memory cell structure of a flash memory.
Figure 24:
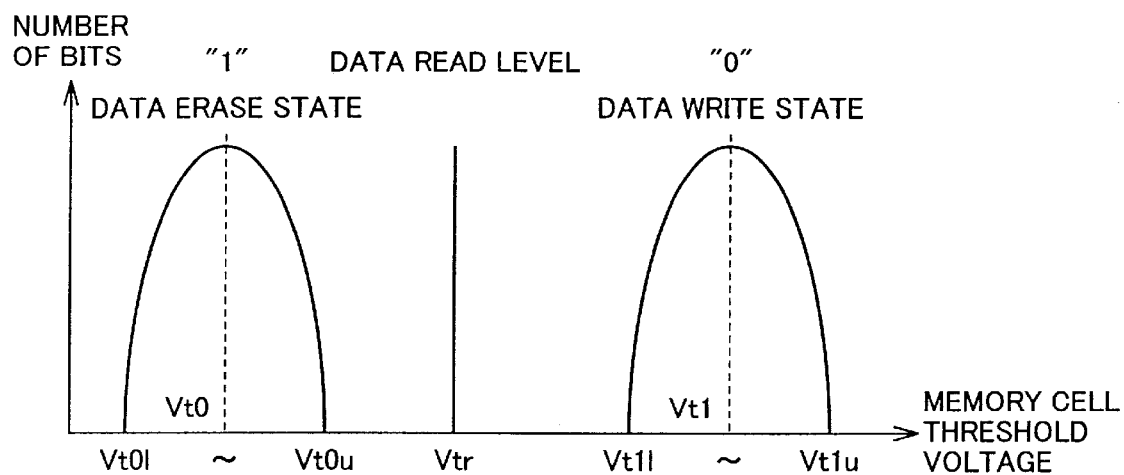
FIG. 24 is a conceptual diagram showing the threshold voltage distribution in the memory cells of a flash memory.
Figure 25:
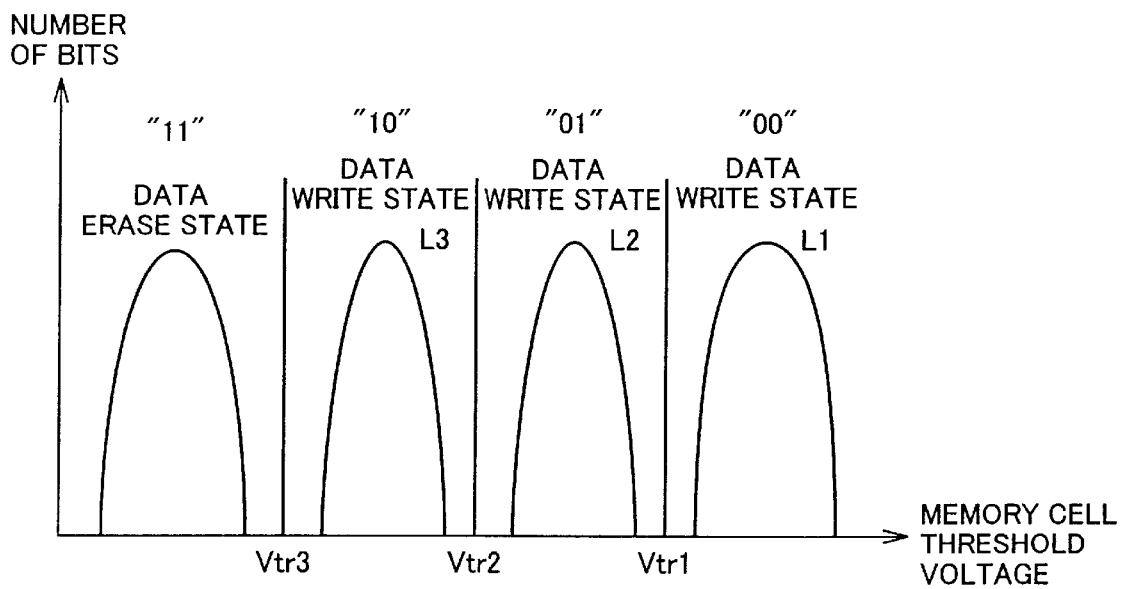
FIG. 25 is a conceptual diagram showing the threshold voltage distribution in the memory cells of a 2 bits/cell flash memory.
Figure 26:
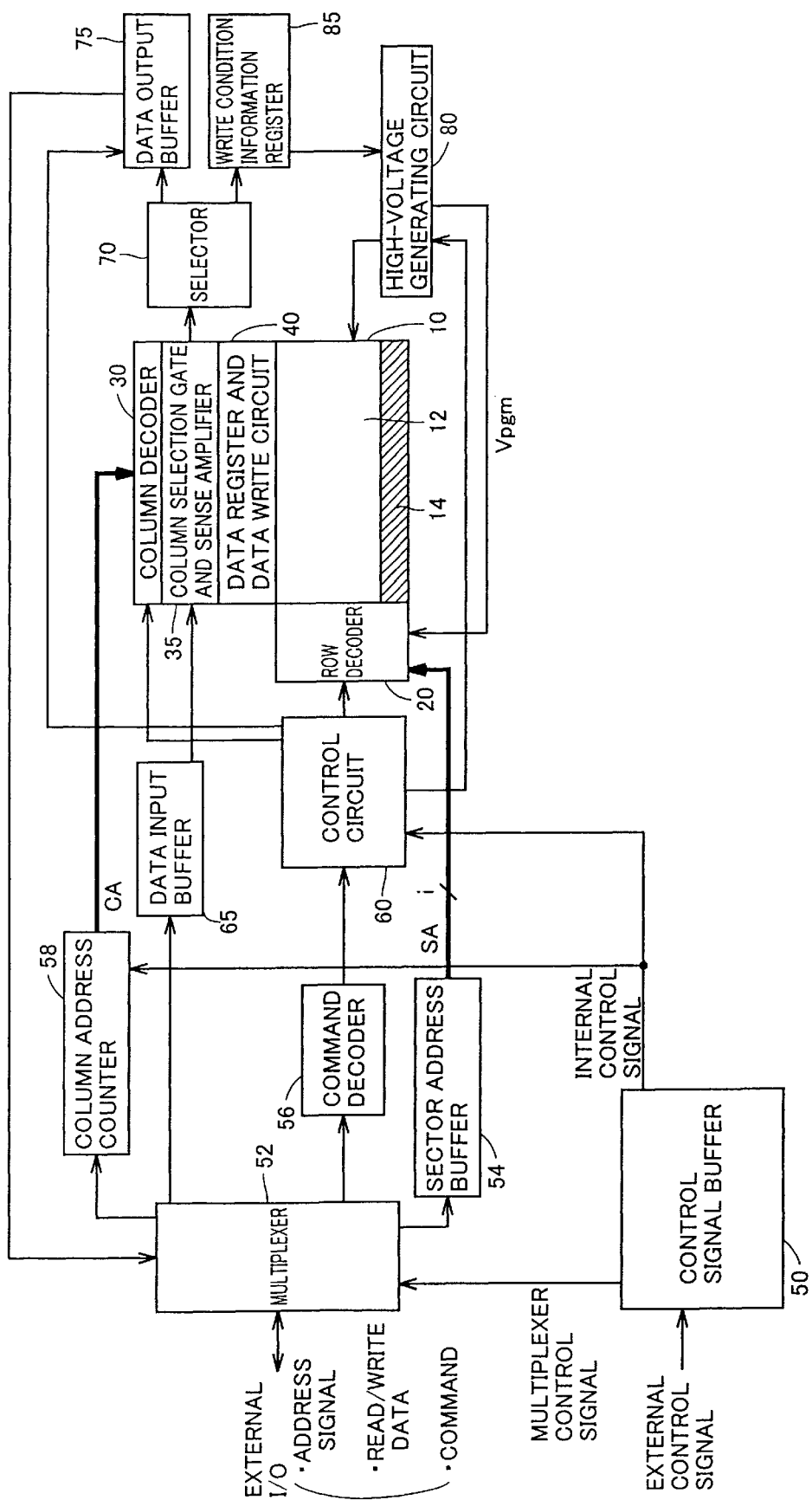
FIG. 26 is a schematic block diagram showing the overall structure of a conventional flash memory having setting of the data write conditions of each sector pre-stored therein.
Figures 27A, 27B, 27C:
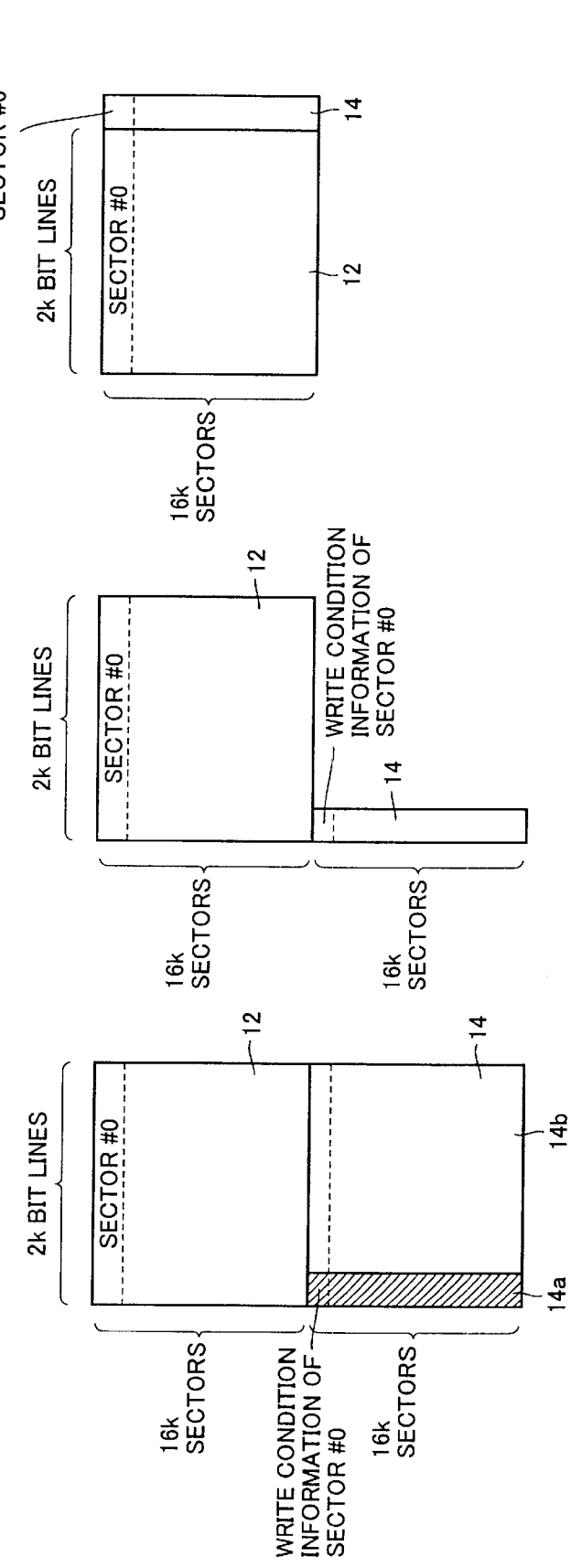
FIGS. 27A to 27C are conceptual diagrams illustrating the problems regarding the arrangement of a write condition storage region.
Figure 28:
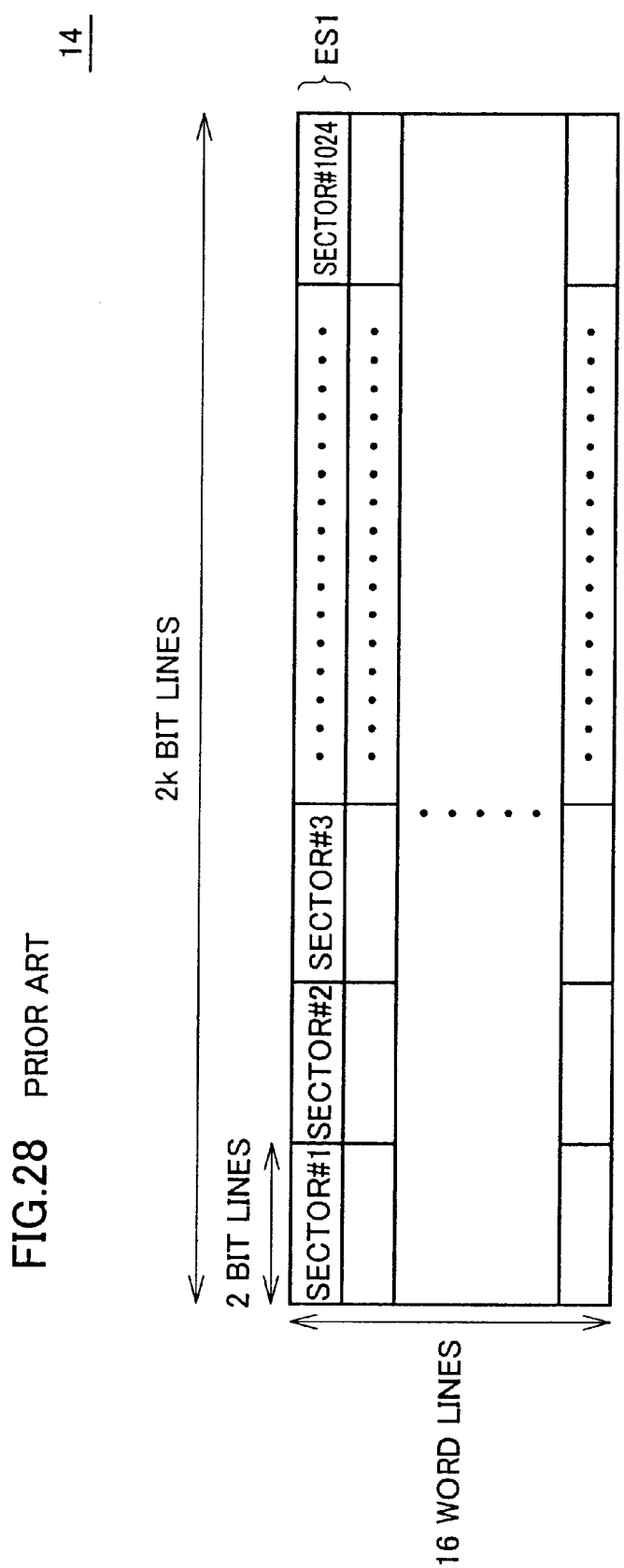
FIG. 28 is a conceptual diagram showing the structure of the write condition storage region of FIG. 26.

The normal memory array 10n corresponds to the normal region 12 of FIG. 26, and includes memory cells MC of a flash memory type arranged in a matrix. The memory cells MC have the same structure as that of the memory cells in a general flash memory shown in FIG. 22.

Word lines WL are provided corresponding to the respective rows of the memory cells MC arranged in a matrix, and bit lines BL are provided corresponding to the respective columns thereof. A source line SL may either extend in the row direction or column direction. FIG. 1 exemplarily shows the word line WL, bit line BL and source line SL corresponding to a single memory cell MC.

In the embodiment of the present invention, each memory cell MC stores 2 bits data, and the storage data level in the data erase state corresponds to "11".

A single data write operation to the normal memory array 10n is formed from three unit write operations having different write levels. More specifically, the following three unit write operations are sequentially conducted in a single data write operation: a unit write operation of level-L1 for writing storage data "00" to the memory cell in the data erase state; a unit write operation of level L2 for writing storage data "01" thereto; and a unit write operation of level L3 for writing storage data "10" thereto.

In each unit write operation, a data write pulse is applied to the word line WL corresponding to the selected sector. The voltage amplitudes of the data write pulse in the unit write operations of levels L1, L2 and L3 correspond to program voltages Vpgm1, Vpgm2 and Vpgm3, respectively.

The row decoder 20n, column decoder 30n, column selection gate and sense amplifier 35n, and data register and data write circuit 40n are provided for the normal memory array 10n.

The row decoder 20n selects a sector of the normal memory array 10n by selective activation of the word line WL according to a sector address SA.

The column decoder 30n conducts column selection of the normal memory array 10n according to a column address CA. In the data read operation, the column selection gate and sense amplifier 35n outputs the read data from the normal memory array 10n according to a voltage on the bit line corresponding to the memory cell column selected by the column decoder 30n.

The data register and data write circuit 40n stores the write data to the sector of interest in the normal memory array 10n. In each unit write operation, the data register and data write circuit 40n sets the voltage on the bit line BL corresponding to the memory cell of interest to the ground voltage Vss, and also sets the voltage on the bit lines BL corresponding to the other memory cells to the write inhibit voltage Vdi.

The flash memory 100 further includes a control signal buffer 50, a multiplexer 52, a sector address buffer 54, a command decoder 56, a column address counter 58, a control circuit 60n, and a data input buffer 65n.

The control signal buffer 50 receives an external control signal for generating an internal control signal and a multiplexer control signal. The multiplexer control signal switches input/output to/from multiplexer 52. For example, at an input of command, the external control signal corresponding to the input command is input to the control signal buffer 50. The multiplexer 52 transmits a signal (i.e. command) from the external input/output (I/O) to the command decoder 56 in response to the multiplexer control signal based on the input external control signal. The control circuit 60n receives the internal control signal to perform predetermined operations, e.g. data read operation, data write operation, and data erase operation corresponding to the output of command decoder 56.

In the data read operation, an address signal is input from the external I/O after a read command. The external control signal corresponding to the read command is input to the control signal buffer 50. The multiplexer 52 transmits the address signal from the external I/O to the sector address buffer 54 in response to the multiplexer control signal based on the input external control signal. The control circuit 60n receives the internal control signal and controls column-related circuits (e.g. the column decoder 30n, column selection gate and sense amplifier 35n, and data register and data write circuit 40n) to perform predetermined read operation with selecting the sector corresponding to the input address signal. Furthermore, an external control signal for outputting read data is input to the control signal buffer 50. The multiplexer 52 transmits the read data from the data output buffer 75 to the external I/O, in response to the multiplexer control signal based on the input external control signal.

In the data write operation, an address signal is input from the external I/O after a write command. The external control signal corresponding to the write command is input to the control signal buffer 50. The multiplexer 52 transmits the address signal from the external I/O to the sector address buffer 54 in response to the multiplexer control signal based on the input external control signal. Next, each write data is set to the data register and data write circuit 40n through column selection gate and sense amplifier 35n. At this timing, an external control signal to transmit write data from the external I/O to the data input buffer 65n is input to the control signal buffer 50. The multiplexer 52 transmits the write data to the data input buffer 65n in response to the multiplexer control signal based on the input external control signal. The column address counter 58 conducts a count-up operation to sequentially address a plurality of memory cell columns and transmits a column address CA to the column decoder 30n. Write data sequentially input from the external I/O are set to the data register and data write circuit 40n according to the counted-up column addresses.

Next to the write command, a confirm command is input from the external I/O. The external control signal corresponding to the confirm command is input to the control signal buffer 50. The multiplexer 52 transmits a signal (i.e. confirm command) from the external I/O to the command decoder 56 in response to the multiplexer control signal based on the input external control signal. The control circuit 60 starts a data write operation to the a normal memory array 10n, in response to the output of the command decoder 56 and the internal command signal. In the data write operation, a data write pulse is applied to each of the memory cells included in the selected sector by the address signal in the normal memory array 10n.

In the data write operation, the control circuit 60n gives an instruction to the row decoder 20n on the application timing and pulse width of the data write pulse to the word line WL of the normal memory array 10n.

The flash memory 100 further includes a data output buffer 75, and a high-voltage generating circuit 80n provided for the normal memory array 10n.

In the data read operation, the data output buffer 75 outputs the data read from the normal memory array 10n to the external I/O through the multiplexer 52.

The high-voltage generating circuit 80n produces the program voltages Vpgm1 to Vpgm3 according to write condition information PD held in a write condition information register 85. The program voltages Vpgm1 to Vpgm3 are respectively used in the unit write operations of levels L1, L2 and L3.

In each unit write operation, the row decoder 20n applies a data write pulse to the word line WL corresponding to the sector address SA, based on the timing and pulse width designated by the control circuit 60n.

The voltage amplitude of the data write pulse in each unit write operation corresponds to the program voltages Vpgm1 to Vpgm3 produced by the high-voltage generating circuit 80n, respectively.

Accordingly, the row decoder 20n and the control circuit 60n form an electric signal control portion for applying a data write pulse for the data write operation according to the write condition information PD read from a write condition storage portion 105 described below.

The flash memory 100 further includes the write condition storage portion 105 for storing the data write conditions corresponding to the respective sectors of the normal memory array 10n.

The write condition storage portion 105 includes an extra memory array 10p. The extra memory array 10p has a plurality of memory cells arranged in a matrix, and is formed from a programmable read only memory (PROM). In other words, the memory cells forming the extra memory array 10p are not limited to the cell structure of the flash memory shown in FIG. 22 and any storage element can be used as the memory cells, as long as the data can be written thereto in a non-volatile manner by an electrical input.

Figure 2:
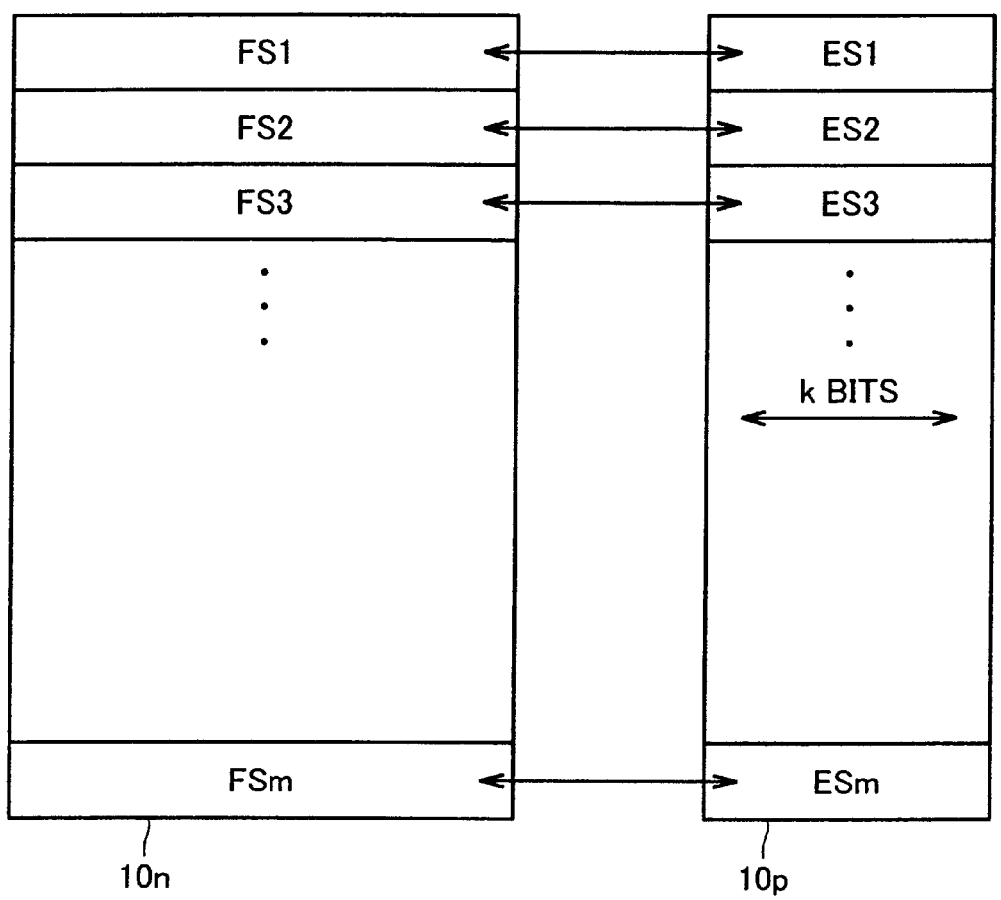
FIG. 2 is a schematic block diagram of the structure of an extra memory array shown in FIG. 1.

Referring to FIG. 2, the normal memory array 10n is divided into a plurality of sectors FS1, FS2, FS3 to FSm (where m is a natural number). A memory cell group of the same row coupled to the same word line WL forms the same sector. In other words, each sector has a plurality of memory cells that are subjected to a single data read operation and a single data write operation.

The data write conditions of each of the sectors FS1 to FSm is represented by k-bit write condition information PD (where k is a natural number).

The extra memory array 10p has extra sectors ES1 to ESm respectively corresponding to the sectors FS1 to FSm. Each of the extra sectors ES1 to ESm has k memory cells for storing the k-bit write condition information PD.

In the extra memory array 10p as well, word lines are provided respectively corresponding to the extra sectors ES1 to ESm, so that k memory cells of the same extra sector are selected by the same word line. Accordingly, the extra memory array 10p is sized to have m rows by k columns. Thus, m word lines and k bit lines are provided for the extra memory array 10p.

Such a structure enables the respective write condition information corresponding to the sectors FS1 to FSm of the normal memory array 10n to be stored in and read from the independent extra sectors ES1 to ESm of the extra memory array 10p, respectively. Accordingly, possible damages to the stored write condition information in the extra memory array 10p resulting from the read disturb can be suppressed even when the data is successively written to a plurality of sectors of the normal memory array 10n.

Note that the number of bits k of the write condition information may be set to any value. As the number of bits is increased, the data write conditions can be set more specifically. However, a required number of memory cells is increased, or reliability of the data is reduced when the write condition information is stored in a single memory cell as multi-level data. Therefore, the first embodiment is described for the case of k=2 bits.

Referring back to FIG. 1, the write condition storage portion 105 further includes a row decoder 20p, a column decoder 30p, a column selection gate and sense amplifier 35p, a data register and data write circuit 40p, a control circuit 60p, and a data input buffer 65p, all of which are provided for the extra memory array 10p.

The row decoder 20p, column decoder 30p, column selection gate and sense amplifier 35p, and data register and data write circuit 40p operate for the extra memory array 10p in the same manner as that the row decoder 20n, column decoder 30n, column selection gate and sense amplifier 35n, and data register and data write circuit 40n operate for the normal memory array 10n.

The control circuit 60p instructs the write and read operations of the write condition information PD to and from the extra memory array 10p in response to a command produced by the command decoder 56.

The data input buffer 65p receives the write condition information PD from the external I/O through the multiplexer 52, and transmits the received write condition information PD to the data register and data write circuit 40p. The write condition information PD indicates the data write conditions of each sector in the normal memory array 10p.

The high-voltage generating circuit 80p produces a high voltage Vpp for writing the data to the memory cell in the extra memory array 10p. This high voltage Vpp is set to a fixed level regardless of the sector selection in the normal memory array 10n.

In the data write operation, the control circuit 60p instructs reading of the write condition information PD corresponding to the sector of interest in the normal memory array 10n. The sector address SA, which is in common to the normal memory array 10n, is transmitted to the row decoder 20p.

The write condition information register 85 retains the write condition information PD read from the selected extra sector of the extra memory array 10p.

The high-voltage generating circuit 80n produces the program voltages Vpgm1, Vpgm2 and Vpgm3 based on the write condition information PD retained in the write condition information register 85. The program voltages Vpgm1, Vpgm2 and Vpgm3 correspond to the voltage amplitude of the data write pulse in the normal memory array 10n.

Figures 3, 4:
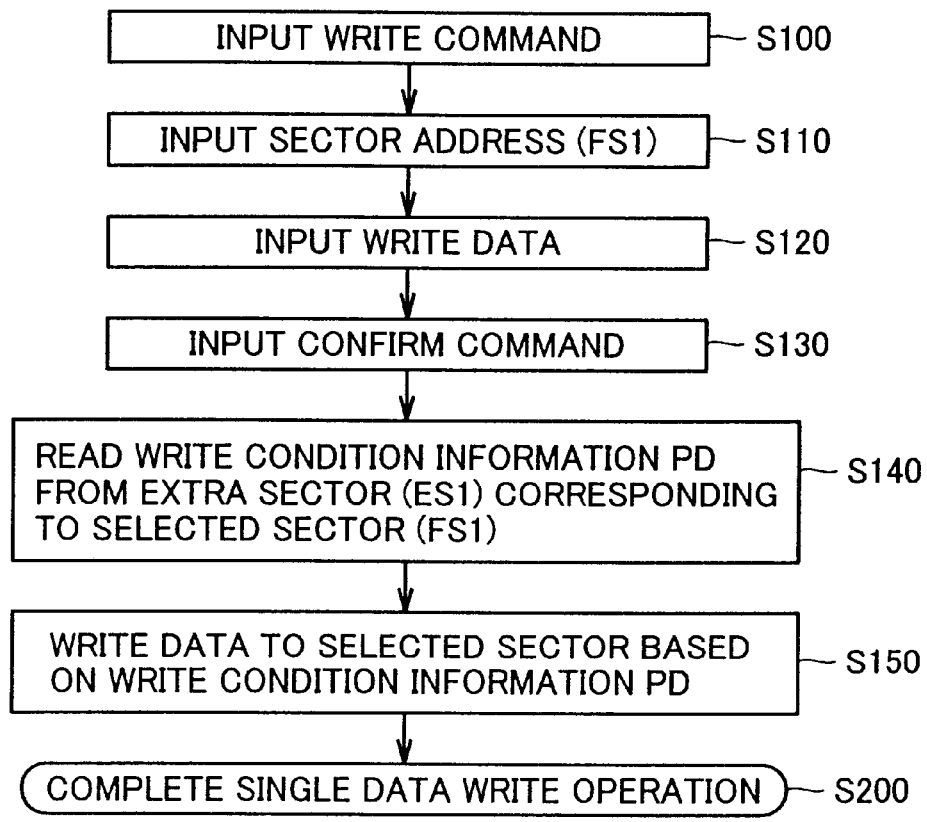
FIG. 3 is a flowchart showing a process flow of a data write operation in the flash memory according to the first embodiment.
FIG. 4 is a diagram showing the correspondence between write condition information retained in a write condition information register and program voltages generated by a high-voltage generating circuit.

Referring to FIG. 3, when an external write command is input (step S100), a sector address SA for selecting the sector of interest and write data are input from the external I/O (steps S110 and S120). It is assumed in FIG. 3 that the first sector FS1 is selected from the normal memory array 10n. Moreover, a confirm command is input to instruct execution of a write confirm operation (verify operation) in the data write operation (step S130).

After the command, data and address required for the data write operation have been input, the write condition information PD corresponding to the sector FS1 is read from the write condition storage portion 105 (step S140). More specifically, the row decoder 20p selects the extra sector ES1 corresponding to the selected sector FS1 of the normal memory array 10n, according to the sector address SA that is common to the row decoder 20n. According to the instruction from the control circuit 60p, the write condition information PD stored in the extra sector ES1 is read and retained in the write condition information register 85.

Hereinafter, the correspondence between the write condition information PD retained in the write condition information register 85 and the program voltages generated by the high-voltage generating circuit 80n will be described.

Referring to FIG. 4, the write condition information PD is formed from two bits: an upper bit P(1) and a lower bit P(0). Each extra sector has two memory cells. Therefore, each memory cell in the extra memory array 10p stores 1-bit data.

When the write condition information PD read from the extra memory array 10p is "00", the program voltages Vpgm1, Vpgm2 and Vpgm3 are respectively set to voltages V1s (e.g., 17.0 V), V2s (e.g., 16.0 V) and V3s (e.g., 15.0 V) corresponding to the standard conditions. In other words, the storage data "00" is written to each of the two memory cells included in the extra sector that stores the write condition information corresponding to the sector having the standard data write characteristics.

When the write condition information PD is "01", the program voltages Vpgm1, Vpgm2 and Vpgm3 are respectively set to voltages V1h (e.g., 17.5 V), V2h (e.g., 16.5 V) and V3h (e.g., 15.5 V) corresponding to the conditions of a larger voltage amplitude. In other words, the data is written to one of the two memory cells included in the extra sector that stores the write condition information corresponding to the sector having a lower data write speed, i.e., to the memory cell corresponding to the upper bit P(1). The other memory cell is held in the erase state ("1").

When the write condition information PD is "10", the program voltages Vpgm1, Vpgm2 and Vpgm3 are respectively set to voltages V1l (e.g., 16.5 V), V2l (e.g., 15.5 V) and V3l (e.g., 14.5 V) corresponding to the conditions of a smaller voltage amplitude. In other words, the data is written to one of the two memory cells included in the extra sector that stores the write condition information corresponding to the sector having a higher data write speed, i.e., to the memory cell corresponding to the lower bit P(0). The other memory cell is held in the erase state ("1").

The data is written to the selected sector, based on the write condition information PD.

Figure 5:
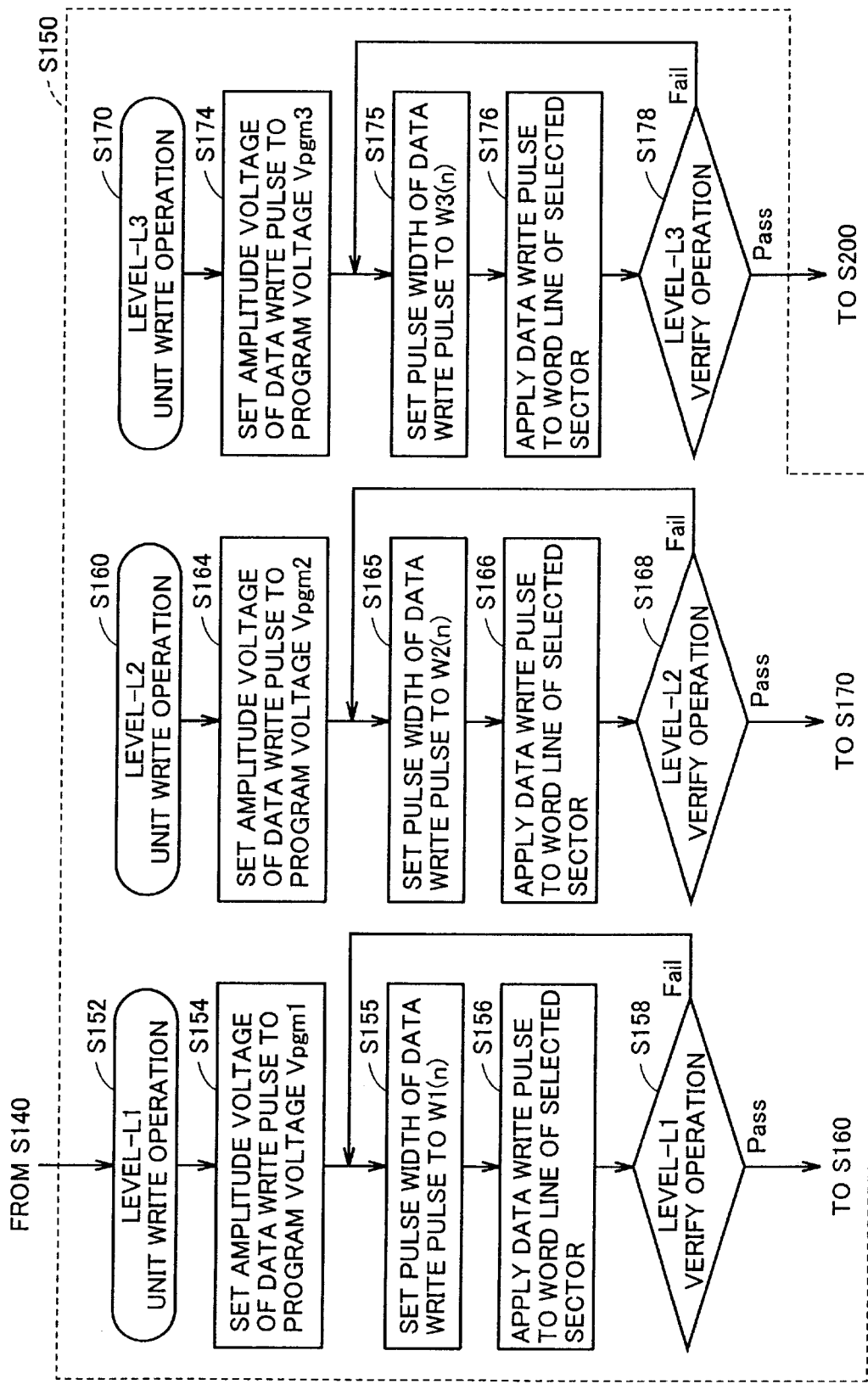
FIG. 5 is a flowchart illustrating a data write operation to a single selected sector.

FIG. 5 is a flow chart illustrating the data write operation to a single selected sector.

As described before, a single data write operation to a single selected sector is formed from three unit write operations of level L1 to L3.

First, the unit write operation of level L1 (write data level "00") is conducted (step S152). The amplitude voltage of the data write pulse for use in the unit write operation of level L1 is set to the program voltage Vpgm1 generated by the high-voltage generating circuit 80n, based on the write condition information PD (step S154).

The pulse width of the data write pulse is set by the control circuit 60n (step S155). In the first application of the data write pulse, the pulse width thereof is set to W1.

The data write pulse according to the conditions set in steps S154 and S156 is applied to the word line WL corresponding to the sector address SA (step S156). In parallel therewith, the data register and data write circuit 40n sets the voltage on the bit line corresponding to the memory cell of interest of level L1 (storage data "00") to the ground voltage Vss, and also sets the voltage on the other bit lines to the write inhibit voltage Vdi. Thus, the unit write operation of level L1 to the selected sector is conducted.

After the data write pulse has been applied, the write confirm operation (verify operation) of level L1 is conducted (step S158).

The verify operation is conducted by reading the data from the sector of interest and verifying whether the read data matches the write data or not.

When it is determined from the verify operation that the unit write operation of level L1 has failed to be conducted normally (Fail), the write operation of level L1 is again conducted with the pulse width being varied. More specifically, in the second application of the data write pulse, the pulse width thereof is set to r1 times the pulse width W1 of the first application (where r1 is a real number that is larger than 1) (step S155).

The data write operation of level L1 is again conducted by application of the data write pulse voltage having the reset pulse width (step S156). Then, the verify operation is again conducted (step S158). Thus, the data write pulse is repeatedly applied with its pulse width being varied, until the unit write operation of level L1 is conducted normally.

The pulse width W1(n), i.e., the pulse width in the nth application of the data write pulse (where n is a natural number), is set as given by the following equation (1):

$$W1(n)=r1^{(n-1)} \cdot W1 \qquad (1)$$

Increasing the pulse width by exponentiation enables the data to be reliably written in each unit write operation.

When it is determined from the verify operation that the unit write operation of level L1 has been conducted normally (Pass), the unit write operation of level L2 is started (step S160).

The unit write operation of level L2 (write data level "01") is conducted according to the same flow as that of the unit write operation of level L1 except for the setting conditions of the data write pulse. In other words, the data write pulse is repeatedly applied with its pulse width being varied, until the unit write operation of level L2 is conducted normally (steps S164 to S168).

The amplitude voltage of the data write pulse for use in the unit write operation of level L2 is set to the program voltage Vpgm2 generated by the high-voltage generating circuit 80n, based on the write condition information PD (step S164).

In the unit write operation of level L2, the pulse width W2(n), i.e., the pulse width in the $n^{th}$ application of the data write pulse (where n is a natural number), is given by the following equation (2):

$$W2(n)=r2^{(n-1)} \cdot W2 \qquad (2)$$

In the equation (2), W2 is the pulse width in the first application of the data write pulse, and r2 is a prescribed real number that is larger than 1.

When the unit write operation of level L2 is completed normally, the unit write operation of level L3 is started (step S170).

The unit write operation of level L3 (write data level "10") is conducted according to the same flow as that of the unit write operation of level L1 except for the setting conditions of the data write pulse. In other words, the data write pulse is repeatedly applied with its pulse width being varied, until the unit write operation of level L3 is conducted normally (steps S174 to S178).

The amplitude voltage of the data write pulse for use in the unit write operation of level L3 is set to the program voltage Vpgm3 generated by the high-voltage generating circuit 80*n*, based on the write condition information PD (step S174).

In the unit write operation of level L3, the pulse width W3(n), i.e., the pulse width in the $n^{th}$ application of the data write pulse (where n is a natural number), is given by the following equation (3):

$$W3(n) = r3^{(n-1)} \cdot W3 \qquad (3)$$

In the equation (3), W3 is the pulse width in the first application of the data write pulse, and r3 is a prescribed real number that is larger than 1.

When all of the unit write operations of levels L1, L2 and L3 to the sector of interest are completed normally, the data write operation to that sector is terminated (Step S200). A single data write operation is thus terminated.

Thus, by setting the real numbers r1, r2 and r3, i.e., the power ratios, to a value larger than 1, the data write pulse is repeatedly applied with its pulse width progressively increased, until each unit write operation is completed. Alternatively, the real numbers r1, r2 and r3 may be set to a value larger than zero but less than 1, so that the data write pulse is repeatedly applied with its pulse width progressively decreased.

Referring back to FIG. 3, the data is written to the sector FS1 of the normal memory array 10*n* based on the program voltages Vpgm1, Vpgm2 and Vpgm3 that are set according to the write condition information read from the extra memory array 10*p* in step S140 (step S150).

Figure 6:
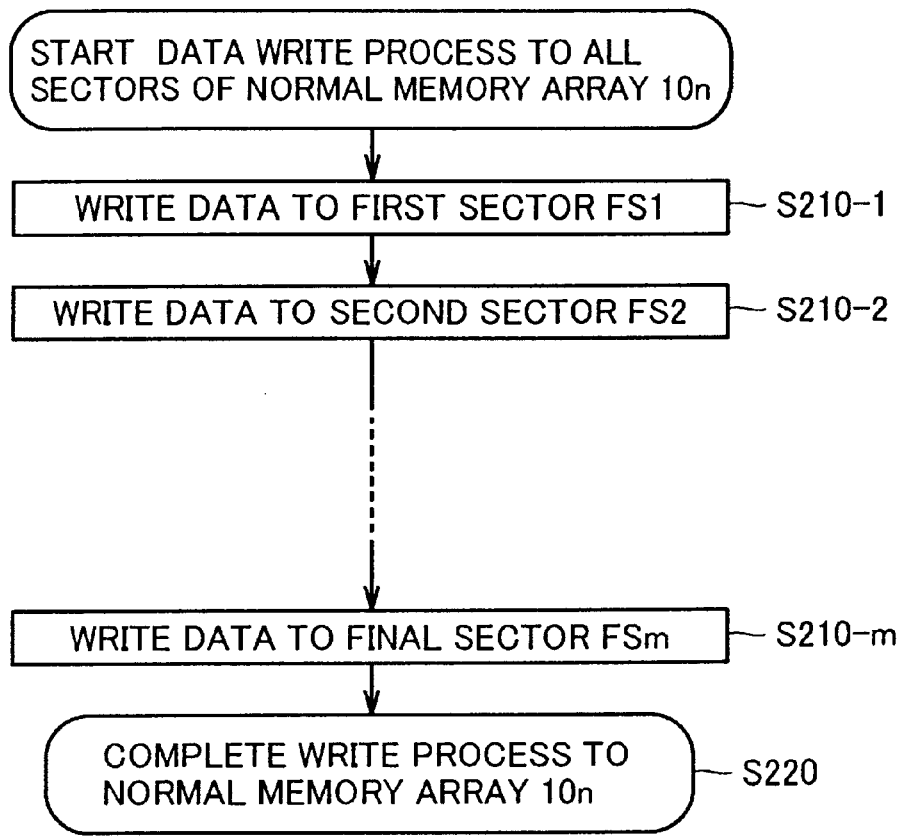
FIG. 6 is a flowchart illustrating the operation of successively writing the data to a plurality of sectors.

FIG. 6 is a flowchart showing a process flow of successively writing the data to a plurality of sectors.

FIG. 6 shows the data write process to all sectors of the normal memory array 10*n*.

Referring to FIG. 6, the data write operation to the normal memory array 10*n* in the data erase state is sequentially conducted on a sector-by-sector basis.

In other words, the data write operation to a single sector, i.e., the data write operation comprised of steps S100 to S200 shown in FIGS. 3 and 5, is first conducted for the first sector FS1 (step S210-1). When the data write operation to the sector FS1 is completed, the data write operation to the following sector FS2 is started (step S210-2). Thus, every time the data write operation to a single sector is completed normally, the data write operation to the following sector is started. When the data write operation to the final sector FSm is completed normally (step S210-m), the data write operation to the normal memory array 10*n* is completed (step S220).

The extra memory array 10*p* stores the write condition information PD in the independent extra sectors ES1 to ESm respectively corresponding to the sectors FS1 to FSm of the normal memory array 10*n*. Accordingly, in each of the steps S210-1 to S210-m of the data write operation to the sectors FS1 to FSm, the data is read from only a corresponding one of the extra sectors.

Consequently, possible damages to the write condition information PD resulting from excessive read disturb can be suppressed while efficiently arranging the memory cells of the extra memory array 10*p*.

As a result, in the flash memory of the first embodiment, the data write operation to each sector can be conducted based on the optimal data write conditions of the respective sector that are obtained in advance from the operation testing or the like.

Accordingly, for the sector having a relatively lower write speed, the voltage amplitude of the data write pulse is increased, so that the data write operation can be completed quickly. For the sector having a relatively high write speed, the data write pulse having a smaller voltage amplitude is used, so that the variation in threshold voltage resulting from over-programming can be prevented. This allows an appropriate data write operation to be conducted on a sector-by-sector basis in view of the variation in memory cell characteristics resulting from the manufacturing variation.

Second Embodiment

The second embodiment will be described in terms of the structure capable of reducing the size of the extra memory array 10*p*.

Figure 7:
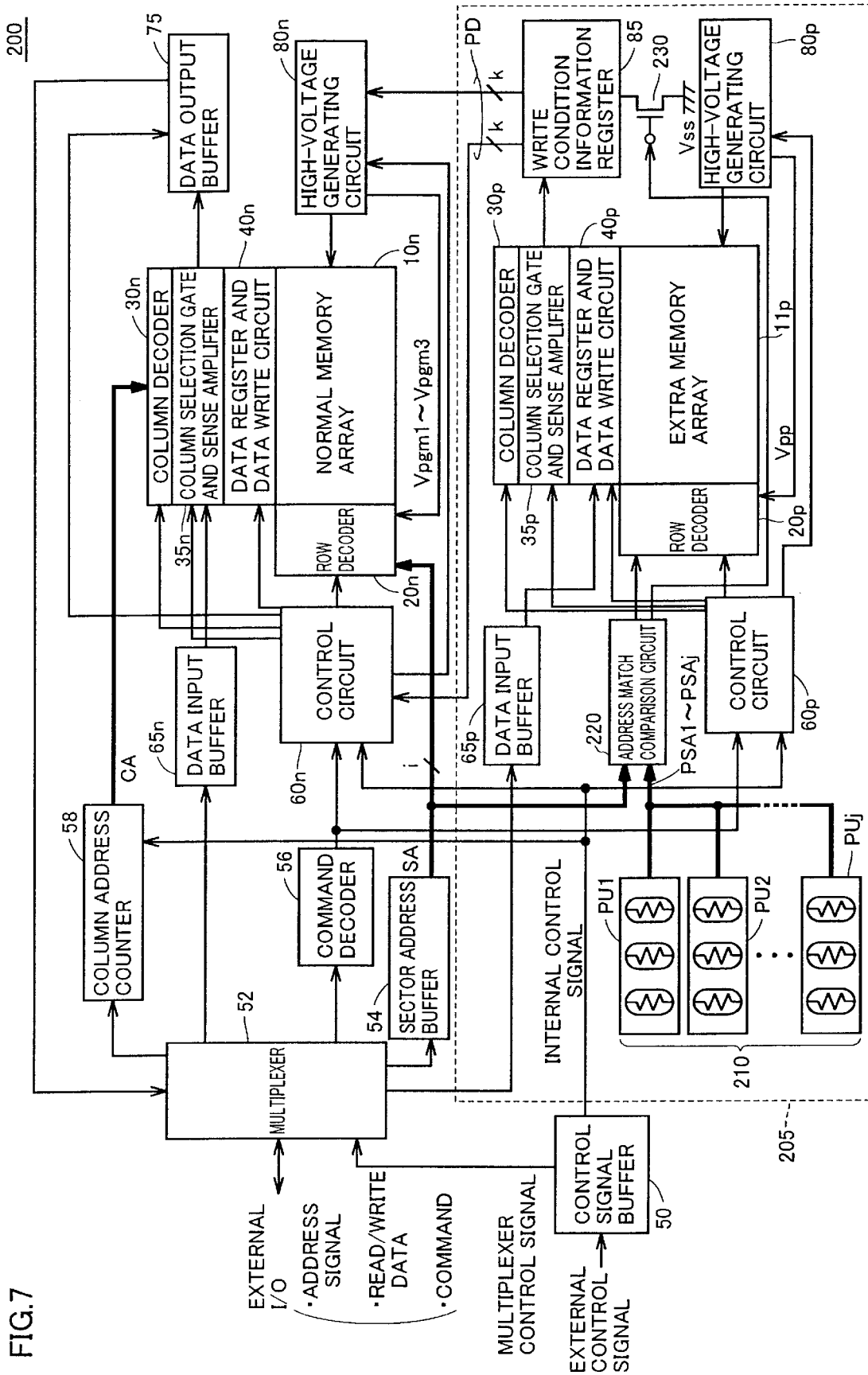
FIG. 7 is a block diagram showing the structure of a flash memory as a typical example of a non-volatile semiconductor memory device according to a second embodiment of the present invention.

Referring to FIG. 7, a flash memory 200 according to the second embodiment is different from the flash memory 100 of the first embodiment in that the write condition storage portion 105 is replaced with a write condition storage portion 205. Since the structure of the flash memory 200 is otherwise the same as that of the flash memory 100, detailed description thereof will not be repeated.

The write condition storage portion 205 is different from the write condition storage portion 105 in that the extra memory array 10*p* is replaced with an extra memory array 11*p*, and in that the write condition storage portion 205 further includes an address storage portion 210, an address match comparison circuit 220 and a register reset circuit 230. Since the structure of the write condition storage portion 205 is otherwise the same as that of the write condition storage portion 105, detailed description thereof will not be repeated.

The address storage portion 210 includes j program units PU1 to PUj (where j is a natural number that is less than m). The program units PU1 to PUj are formed from, e.g., fuse elements, and respectively store designation addresses PSA1 to PSAj in a non-volatile manner. Each of the designation addresses PSA1 to PSAJ corresponds to a sector address for designating one of the sectors FS1 to FSm of the normal memory array 10*n*.

The extra memory array 10*p* of the first embodiment includes m extra sectors ES1 to ESm respectively corresponding to the sectors FS1 to FSm of the normal memory array 10*n*. In contrast, the extra memory array 11*p* of the second embodiment does not store the write condition information corresponding to every sector, but stores only the data write information corresponding to a sector(s) to which the data write conditions different from the standard conditions are to be applied.

Accordingly, the extra memory array 11*p* includes j extra sectors. Each extra sector has k memory cells, and stores k-bit write condition information PD. Note that the second embodiment is also described for the case of k=2.

Figure 8:
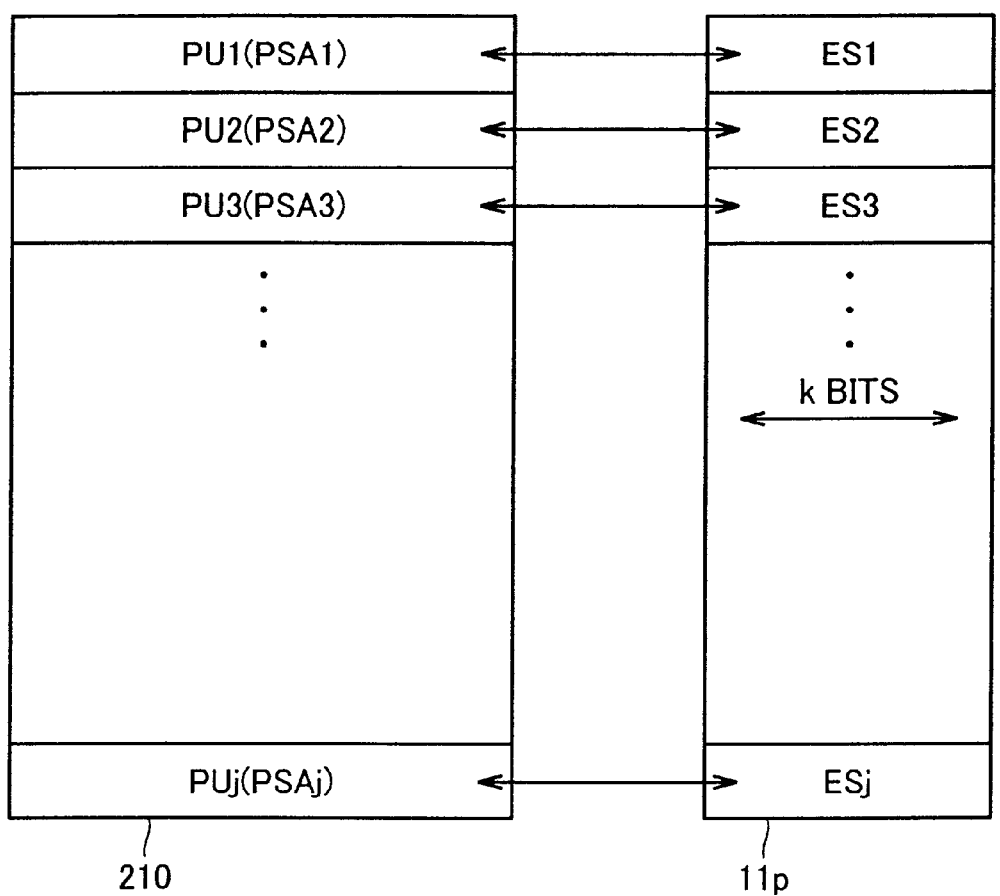
FIG. 8 is a conceptual diagram illustrating the structure of an extra memory array according to the second embodiment.

Referring to FIG. 8, the extra sectors ES1 to ESj of the extra memory array 11*p* correspond to the designation addresses PSA1 to PSAj stored in the program units PU1 to PUj, respectively.

The designation addresses PSA1 to PSAj respectively correspond to the sector addresses of the sectors whose data write characteristics are different from the standard, i.e., the sectors to which the data write conditions different from the standard conditions are to be applied. In other words, in the flash memory 200 of the second embodiment, the data write conditions different from the normal conditions are applied to j sectors, so that an appropriate data write operation can be conducted.

The extra sector ES1 retains the write condition information corresponding to the sector of the designation address PSA1 stored in the program unit PU1. The following extra sectors store the write condition information similarly. Accordingly, the extra memory array 11p can store the write condition information for implementing appropriate data write conditions for the sector(s) whose data write characteristics are different from the standard conditions.

Referring back to FIG. 7, the address match comparison circuit 220 compares the sector address SA received from the sector address buffer 54 with the designation address PSA1 to PSAj pre-stored in the address storage portion 210 so as to check if they match each other. The sector address SA indicates the sector selected for the data write operation.

Figure 9:
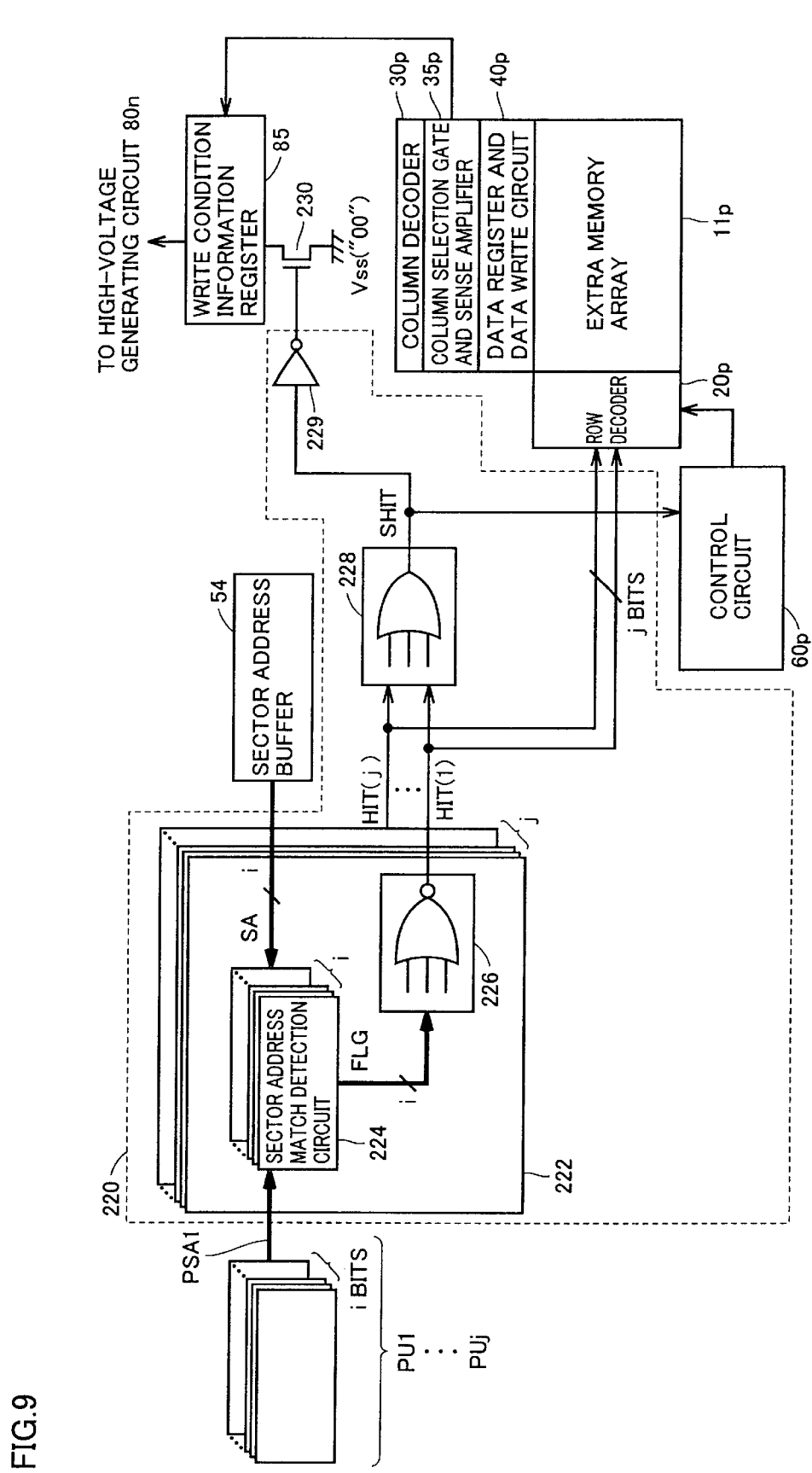
FIG. 9 is a circuit diagram illustrating the structure of an address match comparison circuit shown in FIG. 7.

FIG. 9 is a circuit diagram illustrating the structure of the address match comparison circuit 220.

The address match comparison circuit 220 includes j address comparison units 222 respectively corresponding to the program units PU1 to PUj. Each address comparison unit has the same structure and operation. Therefore, the structure of the address comparison unit corresponding to the program unit PU1 is exemplarily described in FIG. 9.

The address comparison unit 222 includes i sector address match detection circuits 224 for detecting a match between an i-bit sector address SA and an i-bit designation address PSAI stored in the program unit PU1 (where i is a natural number). Each sector address match detection circuit 224 compares the respective corresponding bits of the sector address SA and the designation address PSA1 with each other so as to check if they match each other, and produces a match detection flag FLG according to the match comparison result.

The match detection flag FLG is formed from a total of i bits, and is activated to L level when every bit of the sector address SA and the designation address PSA1 match each other in level.

The address comparison unit 222 further includes a logic gate 226 for receiving each bit of the i-bit match detection flag FLG from the i sector address match detection circuits 224 as its input, and outputting the NOR operation result as an address match detection signal HIT(1). Accordingly, the address match detection signal HIT(1) is activated to H level only when the sector address SA indicating the sector selected for the data write operation completely matches the designation address PSA1 stored in the program unit PU1 on a bit-by-bit basis.

The address comparison units 222 corresponding to the other program units have the same structure. Accordingly, these j address comparison units 222 respectively output address match detection signals HIT(1) to HIT(j) according to the match comparison between the designation addresses PSA1 to PSAj stored in the respective program units and the sector address SA.

The address match comparison circuit 220 further includes a logic (OR) gate 228 receiving the address match detection signals HIT(1) to HIT(j) as its inputs. The logic gate 228 outputs a control signal SHIT.

Accordingly, the control signal SHIT is activated to H level when the sector address SA indicating the sector selected for the data write operation matches any one of the designation addresses PSA1 to PSAj stored in the address storage portion 210. The control signal SHIT is inactivated to L level when the sector address SA does not match any one of the designation addresses PSA1 to PSAj.

The control circuit 60p instructs the data read operation from the extra memory array 11p in response to activation of the control signal SHIT. The sector selection in the extra memory array 11p is conducted according to the j address match detection signals HIT(1) to HIT(j). In other words, when the control signal SHIT is activated, one of the address match detection signals HIT(1) to HIT(j) that corresponds to the designation address matching the sector address SA is activated to H level. Accordingly, when the sector address SA matches any one of the designation addresses, the row decoder 20p can selectively activate the word line of the extra sector storing the write condition information corresponding to the sector selected by the sector address SA.

The write condition information thus read from the extra sector is transmitted from the column selection gate and sense amplifier 35p to the write condition information register 85. Accordingly, when a sector whose corresponding sector address is pre-stored in the address storage portion 210 and to which the data write conditions different from the normal conditions are to be applied is selected, the write condition information pre-stored in the extra memory array 11p is read, so that the high-voltage generating circuit 80n can produce the program voltages Vpgm1 to Vpgm3 based on that write condition information.

On the other hand, when the control signal SHIT is inactivated, i.e., when the sector address SA does not match any one of the designation addresses PSA1 to PSAj, the data write operation to the selected sector need only be conducted according to the normal conditions. In such a case, the data need not be read from the extra memory array 11p.

Accordingly, when the control signal SHIT is inactivated, the control circuit 60p does not conduct the data read operation from the extra memory array 11p. The register reset circuit 230 is activated in response to inactivation of the control signal SHIT. According to the structure of FIG. 9, the output of an inverter 229 goes to H level in response to inactivation (L level) of the control signal SHIT. In response to this, an N-channel transistor of the register reset circuit 230 is turned ON to electrically couple the write condition information register 85 to the ground voltage Vss.

Thus, when the control signal SHIT is inactivated, the write condition information PD retained in the write condition information register 85 is set to "00" corresponding to the ground voltage Vss.

As shown in FIG. 4, when the write condition information PD is set to the state "00", the program voltages Vpgm1 to Vpgm3 are respectively set to the standard voltage levels V1s to V3s. In other words, the standard data write conditions are set.

Accordingly, as in the first embodiment, a standard sector to which the data is to be written under the normal data write conditions is strictly distinguished from a specific sector to which specific data write conditions different from the standard conditions is to be applied, so that the data write conditions can be appropriately set for each sector. Moreover, since the extra memory array 11p retains only the write condition information corresponding to the specific sector(s) of the normal memory array 10n, the area of the extra memory array 11p can be reduced.

Modification of Second Embodiment

Figure 10:
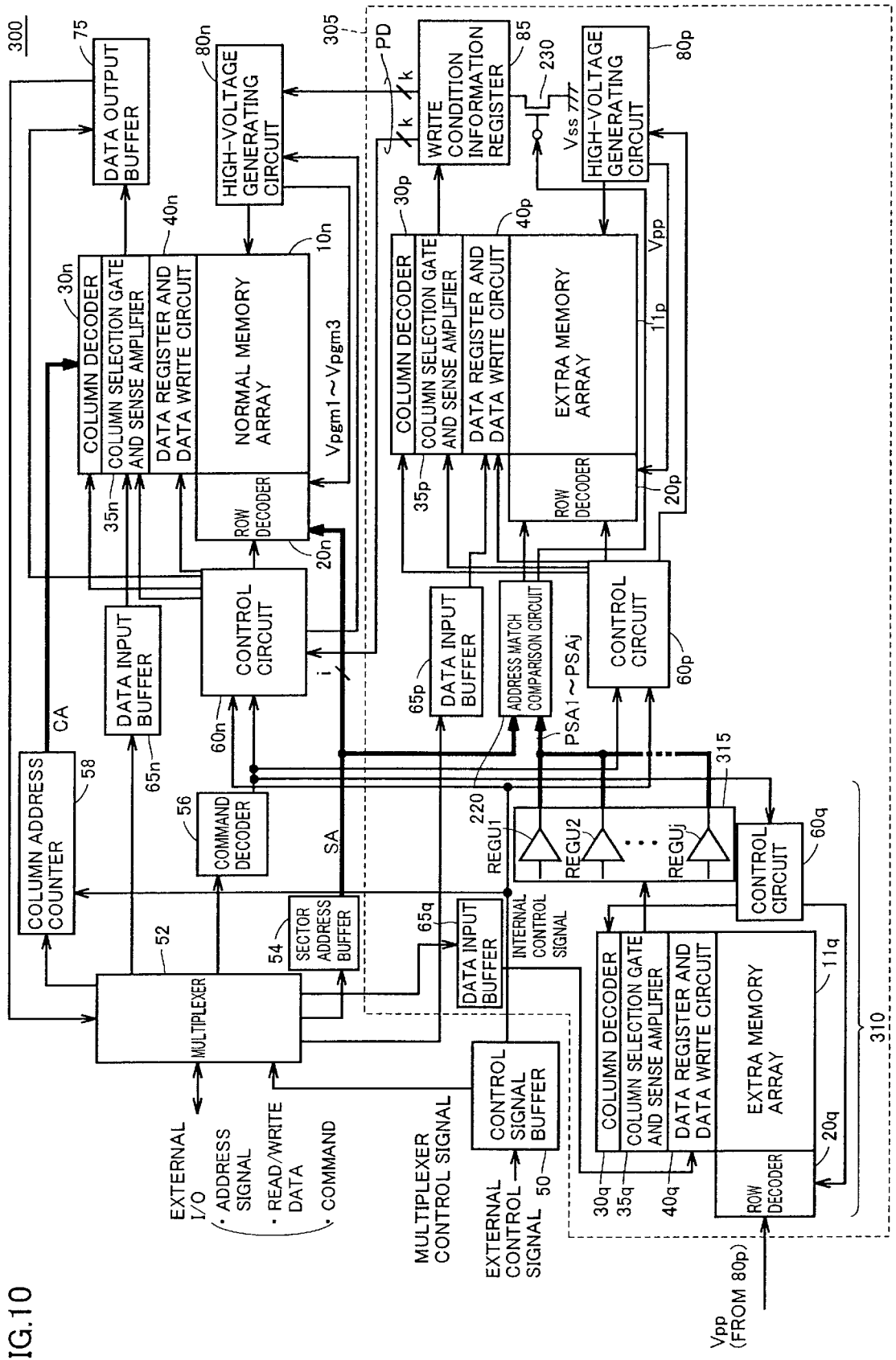
FIG. 10 is a block diagram showing the structure of a flash memory according to a modification of the second embodiment.

Referring to FIG. 10, a flash memory 300 according to the modification of the second embodiment is different from the flash memory 200 of the second embodiment in that the write condition storage portion 205 is replaced with a write condition storage portion 305. Since the structure of the flash memory 300 is otherwise the same as that of the flash memory 200, detailed description thereof will not be repeated.

The write condition storage portion 305 is different from the write condition storage portion 205 in that the address storage portion 210 is replaced with an address storage portion 310.

The address storage portion 310 includes an extra memory array 11$q$. The address storage portion 310 further includes a row decoder 20$q$, a column decoder 30$q$, a column selection gate and sense amplifier 35$q$, a data register and data write circuit 40$q$ and a control circuit 60$q$, which are provided for the extra memory array 11$q$. The address storage portion 310 further includes a designation address buffer circuit 315.

Like the address storage portion 210, the extra memory array 11$q$ stores j designation addresses PSA1 to PSAj. As described before, since each sector address is formed from i bits, the extra memory array 11$q$ must be sized to have j rows by i columns.

When the command decoder 56 produces a command indicating execution of the data write operation, the control circuit 60$q$ instructs reading of the designation addresses PSA1 to PSAj from the extra memory array 11$q$.

The row decoder 20$q$ sequentially activates the j word lines according to the instruction of the control circuit 60$q$. The column decoder 30$q$ sequentially selects the i memory cell columns during selection of each word line so as to sequentially read the i-bit data stored in the same sector.

The designation address buffer circuit 315 includes register units REGU1 to REGUj respectively corresponding to the designation addresses PSA1 to PSAj. The data transmission path between the column selection gate and sense amplifier 35$q$ and the designation address buffer circuit 315 is sequentially switched by the control circuit 60$q$ according to the sector selection in the extra memory array 11$q$.

Thus, in the data write operation, the register units REGU1 to REGUj respectively output the designation addresses PSA1 to PSAj read from the extra memory array 11$q$.

The address match comparison circuit 220 receives the designation addresses PSA1 to PSAj from the designation address buffer circuit 315 and the sector address SA indicating the sector selected for the data write operation in the normal memory array 10$n$, and compares the designation addresses with the sector address so as to check if they match each other.

Since the structure and operation of the address match comparison circuit 220 and the subsequent circuit group are the same as those of the write condition storage portion 205 of FIG. 7, detailed description thereof will not be repeated.

With such a structure, even in the modification of the second embodiment, appropriate data write conditions can be set for each sector of the normal memory array 10$n$ while reducing the area of the extra memory array 11$p$, as in the case of the second embodiment.

Moreover, the fuse elements as shown in FIG. 7 need not be used. Therefore, the designation addresses PSA1 to PSAj indicating the specific sectors having data write characteristics different from the standard can be electrically written and stored without conducting the laser-trimming step.

The extra memory array 11$q$ may be formed from rewritable non-volatile storage elements in order to sequentially rewrite these specific sector addresses. This enables sector-based designation of the data write conditions to be implemented in a more flexible manner.

Note that, in the first and second embodiments and the modification thereof, the data write conditions are set on a sector-by-sector basis by changing the program voltage levels Vpgm1 to Vpgm3 corresponding to the voltage amplitude of the data write pulse. However, the present invention is not limited to this.

More specifically, it is also possible to set at least one of the program voltages Vpgm1 to Vpgm3 in a stepwise manner, and to use only the standard value as the remaining program voltage(s). Alternatively, it is possible to set the pulse width in the first application of the data write pulse.

Although the 2 bits/cell memory cells are used herein, i.e., each memory cell stores 2-bit information, the number of bits of the data stored in each memory cell is not limited to this. Each memory cell can store the data other than 2-bit data by setting the number of bits of the data write information to an appropriate value.

Although the data write conditions have been described, the data erase conditions may also be set on a sector-by-sector basis in the data erase operation. Optimal data erase conditions can be set on a sector-by-sector basis by using the same structure as that of the write condition storage portion to store and read, as required, the information on the data erase conditions.

Third Embodiment

The third embodiment is described in terms of a structure for appropriately setting the data write conditions of unit write operations in a multi-level storage flash memory, i.e., in the case where a single data write operation to the selected sector is formed from a plurality of unit write operations of different levels.

Figure 11:
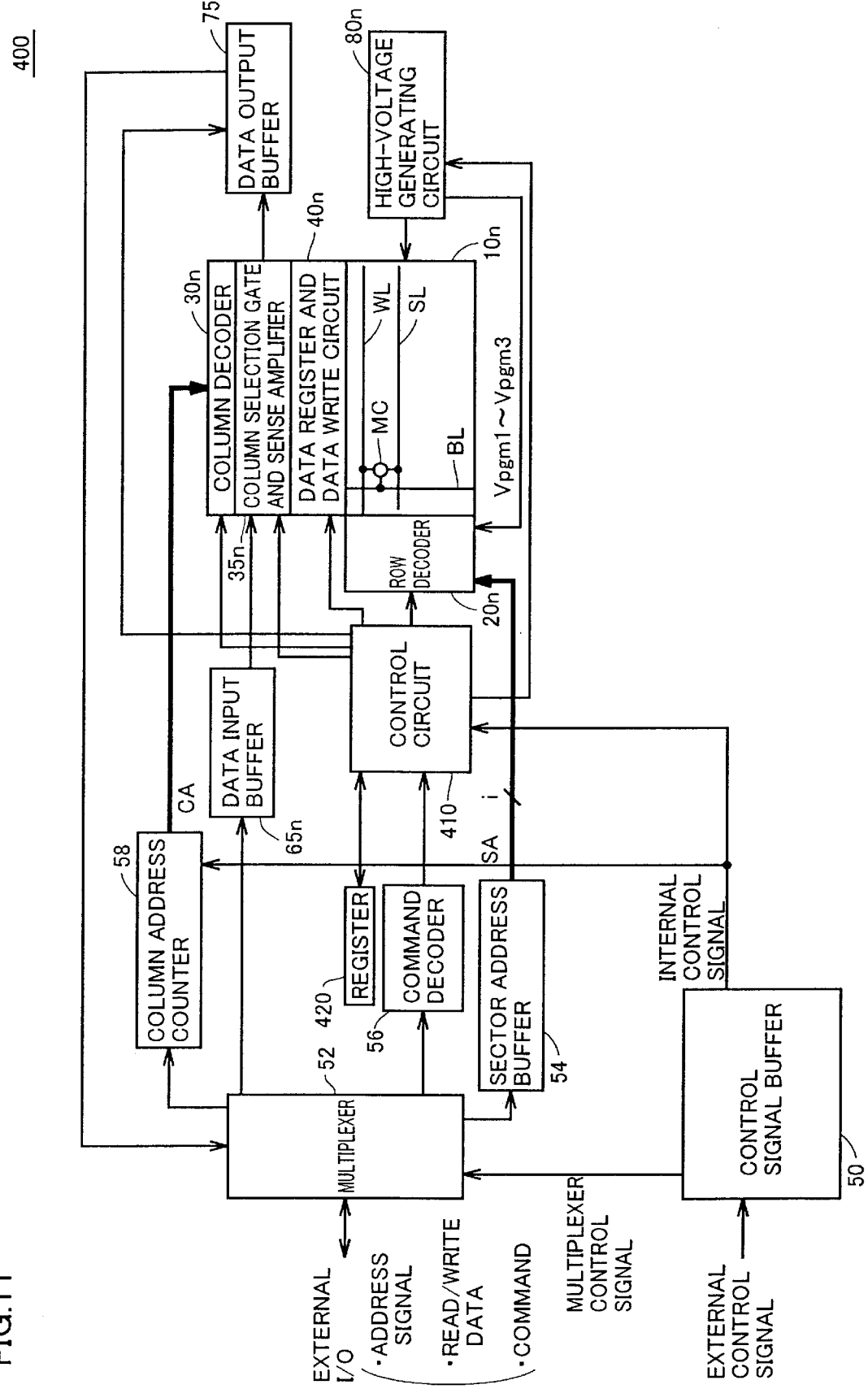
FIG. 11 is a block diagram showing the structure of a flash memory as a typical example of a non-volatile semiconductor memory device according to a third embodiment of the present invention.

Referring to FIG. 11, a flash memory 400 of the third embodiment is different from the flash memory 100 of the first embodiment shown in FIG. 1 in that the flash memory 400 includes a control circuit 410 and a register 420 instead of the control circuit 60$n$. The data produced by the control circuit 410 can be stored in the memory array 10$n$.

The flash memory 400 is also different from the flash memory 100 in that the flash memory 400 neither includes the extra memory array 10$p$ for pre-storing the write condition information, nor the row decoder 20$p$, column decoder 30$p$, column selection gate and sense amplifier 35$p$, data register and data write circuit 40$p$, control circuit 60$p$, data input buffer 65$p$, high-voltage generating circuit 80$p$, and write condition information register 85, which are provided for the extra memory array 10$p$. Since the structure of the flash memory 400 is otherwise the same as that of the flash memory 100 of the first embodiment, detailed description thereof will not be repeated.

Hereinafter, the data write operation to the multi-level storage flash memory will be described.

Figure 12:
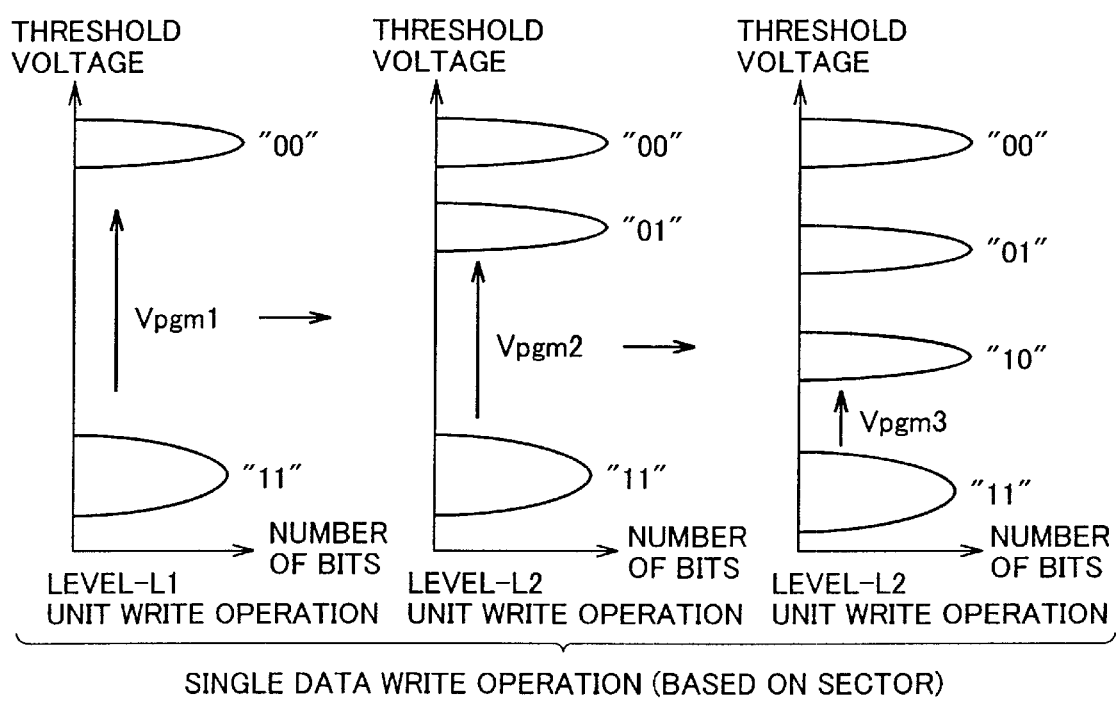
FIG. 12 is a conceptual diagram illustrating a data write operation to a multi-level storage flash memory.

Referring to FIG. 12, as described in the first embodiment, a single data write operation to each sector of the normal memory array 10$n$ is formed from sequentially conducted three unit write operations of different write levels. As described above, the unit write operations for writing the storage data "00", "01" and "10" to a memory cell in the data erase state (storage data "11") are also referred to as level-L1, L2 and L3 unit write operations, respectively.

Figures 13, 14:
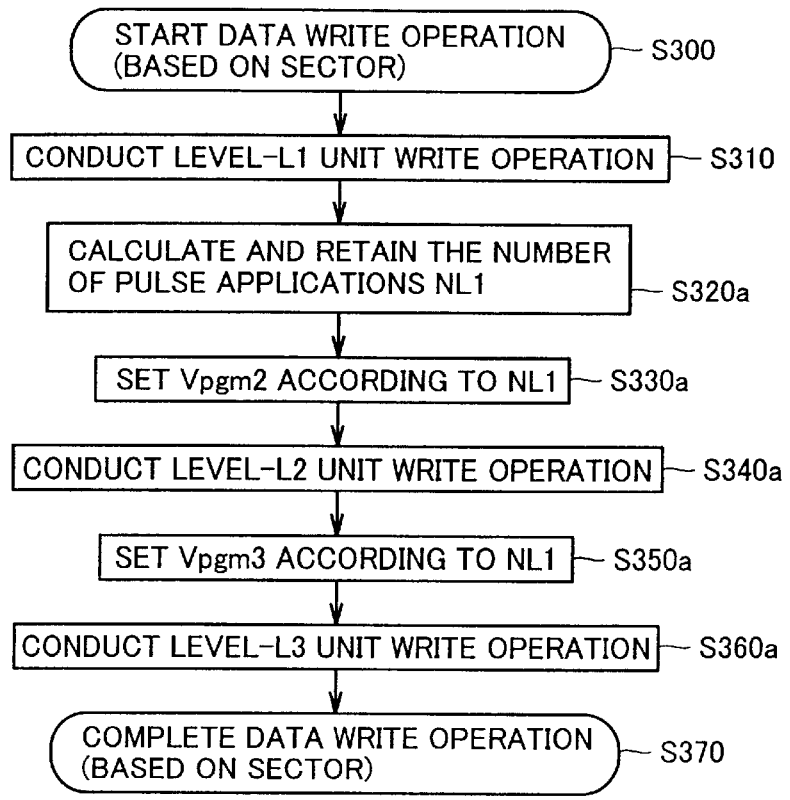
FIG. 13 is a flowchart illustrating the operation of a control circuit according to the third embodiment.
FIG. 14 is a diagram illustrating setting of the data write conditions according to the third embodiment.

FIG. 13 is a flowchart illustrating the operation of the control circuit 410.

Referring to FIG. 13, when a single data write operation to a sector is started in response to a write command input to the normal memory array 10$n$ (step S300), a data write pulse is applied according to prescribed setting conditions (e.g., a program voltage Vpgm1 corresponding to an amplitude voltage of the data write pulse), so that the level-L1 unit write operation is conducted (step S310). The process of step S310 corresponds to a series of processes in steps S152 to S158 shown in the flowchart of FIG. 5.

When the level-L1 unit write operation is completed normally, the control circuit 410 calculates the number of pulse applications conducted according to the write verify operation, and stores the calculated number of pulse applications NL1 in the register 420 (step S320a).

The control circuit 410 sets the data write conditions of the following level-L2 and L3 unit write operations, i.e., the setting conditions of the data write pulse, based on the calculated number of pulse applications NL1 stored in the register 420.

Referring to FIG. 14, the control circuit 410 determines whether the calculated number of pulse applications NL1 in the sector selected for the data write operation is within a normal range, or larger than or smaller than the normal range. When the calculated number of pulse applications NL1 is within the normal range, the sector of interest is determined to have "standard" data write characteristics. When the calculated number of pulse applications NL1 is larger or smaller than the normal range, the sector of interest is determined to have a "higher" or "lower" data write speed, respectively.

Accordingly, when the calculated number of pulse applications NL1 is within the normal range, the write condition information PD is set to "00", and the program voltages Vpgm2 and Vpgm3 are respectively set to the standard values V2s and V3s.

When the calculated number of pulse applications NL1 is larger than the normal range, the write condition information PD is set to "01", and the program voltages Vpgm2 and Vpgm3 are respectively set to the values V2h and V3h that are higher than the standard values. Similarly, when the calculated number of pulse applications NL1 is smaller than the normal range, the write condition information PD is set to "10", and the program voltages Vpgm2 and Vpgm3 are respectively set to the values V2l and V3l that are lower than the standard values.

Thus, for the sector having the standard data write characteristics, the level-L2 and the following unit write operations can be conducted using a data write pulse having a standard voltage amplitude.

For the sector having a lower data write speed, the level-L2 and the following unit write operations can be conducted using a data write pulse having a larger voltage amplitude than the standard. For the sector having a higher data write speed, the level-L2 and the following unit write operations can be conducted using a data write pulse having a smaller voltage amplitude than the standard.

Referring back to FIG. 13, the control circuit 40 instructs the high-voltage generating circuit 80n to produce the program voltage Vpgm2 according to the calculated number of pulse applications NL1 (step S330a).

Then, the level-L2 unit write operation is conducted using the program voltage Vpgm2 (step S340a). The process of step S340a corresponds to a series of processes in steps S160 to S168 shown in the flowchart of FIG. 5.

When the level-L2 unit write operation is completed, the control circuit 40 instructs the high-voltage generating circuit 80n to produce the program voltage Vpgm3 according to the calculated number of pulse applications NL1 (step S350a).

Then, the level-L3 unit write operation is conducted using the program voltage Vpgm3 (step S360a). The process of step S360a corresponds to a series of processes in steps S170 to S178 shown in the flowchart of FIG. 5.

As a result, in the case where a data write operation to each sector is formed from a plurality of unit write operations, whether the sector of interest is a sector having a higher data write speed or a lower data write speed is determined based on the result of the previous unit write operation, so that the data write conditions of the subsequent unit write operation can be set according to this determination.

Accordingly, for the sector having a lower data write speed, the following unit write operation is conducted with a reduced number of pulse applications, thereby allowing for a rapid data write operation. In general, the data write speed varies depending on the number of pulses of the data write pulse applied. In the third embodiment, variation in the number of applications of the data write pulse between the sectors is suppressed, so that variation in data write speed between the sectors can be suppressed.

For the sector having a higher data write speed, overprogramming in the subsequent unit write operation is suppressed, so that variation in threshold voltage distribution after the data write operation can be suppressed.

As a result, the data write operation can be conducted appropriately on a sector-by-sector basis as in the first embodiment without providing any circuit group for pre-storing the data write conditions, such as an extra memory array.

First Modification of Third Embodiment

In the first modification of the third embodiment, the pulse width of the data write pulse is set in the similar manner as that of the third embodiment.

The control circuit according to the first modification of the third embodiment sets the power ratios r2 and r3 described in the first embodiment, based on the calculated number of pulse applications NL1 stored in the register 420.

Note that, except for the operation of the control circuit, the structure and operation of the flash memory of the first modification of the third embodiment is the same as those of the third embodiment shown in FIG. 11. Therefore, detailed description thereof will not be repeated.

Figures 15, 16:
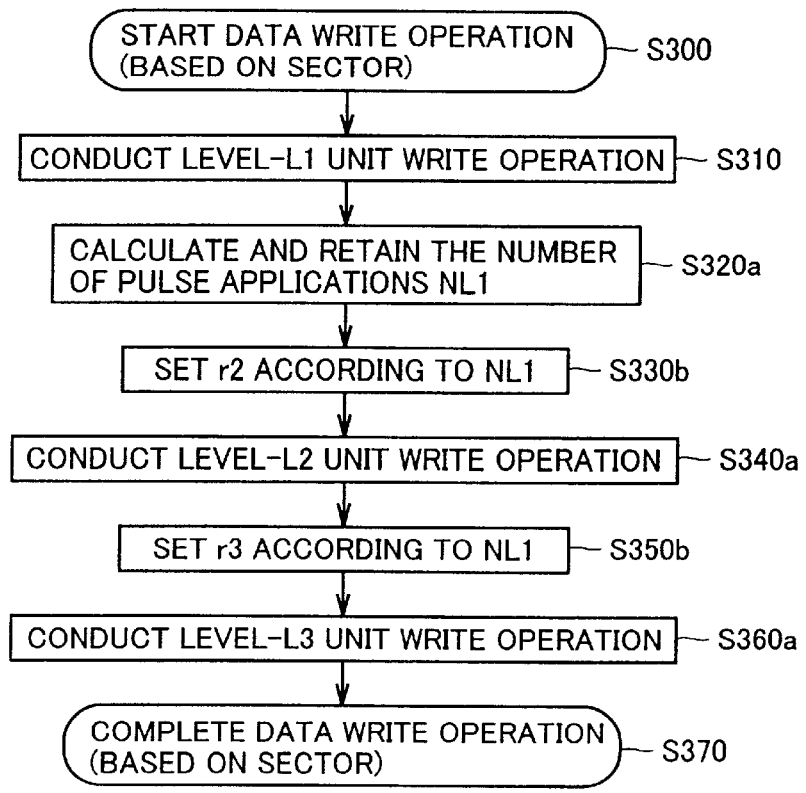
FIG. 15 is a flowchart illustrating the operation of a control circuit according to a first modification of the third embodiment.
FIG. 16 is a diagram illustrating setting of the data write conditions according to the first modification of the third embodiment.

FIG. 15 is a flowchart illustrating the operation of the control circuit according to the first modification of the third embodiment.

Referring to FIG. 15, the process flow of the control circuit according to the first modification of the third embodiment is different from that of the control circuit of the third embodiment shown in FIG. 13 in that steps S330a and S350a are replaced with step S330b and S350b. Since the process flow of the control circuit is otherwise the same as that of the third embodiment, detailed description thereof will not be repeated.

The control circuit according to the first modification of the third embodiment sets the power ratios r2 and r3 according to the calculated number of pulse applications NL1 in steps S330b and S350b, respectively.

Referring to FIG. 16, in the first modification of the third embodiment as well, the data write characteristics of the sector selected for the data write operation are determined based on the calculated number of pulse applications NL1 in that sector.

Accordingly, when the calculated number of pulse applications NL1 is within a normal range, the write condition information PD is set to "00", and the power ratios r2 and r3 are respectively set to the standard values r2s and r3s.

When the calculated number of pulse applications NL1 is larger than the normal range, the write condition information PD is set to "01", and the power ratios r2 and r3 are respectively set to the values r2h and r3h that are larger than the standard values. When the calculated number of pulse applications NL1 is smaller than the normal range, the write condition information PD is set to "10", and the power ratios r2 and r3 are respectively set to the values r2l and r3l that are smaller than the standard values.

Thus, for the sector having the standard data write characteristics, the level-L2 and the following unit write operations can be conducted using a data write pulse having a standard pulse width.

For the sector having a lower data write speed, the level-L2 and the following unit write operations can be conducted using a data write pulse having a wider pulse width than the standard. For the sector having a higher data write speed, the level-L2 and the following unit write operations can be conducted using a data write pulse having a narrower pulse width than the standard.

As a result, for the sector having a lower data write speed, each application period of the data write pulse can be increased as compared to the case of the standard conditions. The data write operation is normally divided into the application period of the data write pulse to the cell, the verify operation period for detecting whether or not the cell threshold value has reached a preset voltage, i.e., whether or not the data write operation has been conducted normally, and the like. Accordingly, each application period of the data write pulse is increased for the sector having a lower data write speed, so that the number of pulses of the data write pulse to be applied is reduced. This enables reduction in time required for the write operation.

For the sector having a higher data write speed, each pulse application period is reduced, thereby allowing for fine control of the write operation.

In other word, the write speed can be increased for the sector having a lower data write speed, as well as overprogramming can be suppressed for the sector having a higher data write speed, thereby suppressing the variation in threshold voltage distribution in the data write state.

This allows an appropriate data write operation to be conducted on a sector-by-sector basis in view of variation in memory cell characteristics resulting from the manufacturing variation, as in the case of the third embodiment.

Regarding setting of the pulse width, not only the power ratios r2 and r3 but also the pulse widths W2 and W3 of the data write pulse initially applied in the unit write operation as given by the equations (2) and (3) can be set similarly.

Second Modification of Third Embodiment

The second modification of the third embodiment is described in terms of the data write operation conducted so as to gradually increase the voltage amplitude of the data write pulse repeatedly applied by the verify operation.

Figure 17:
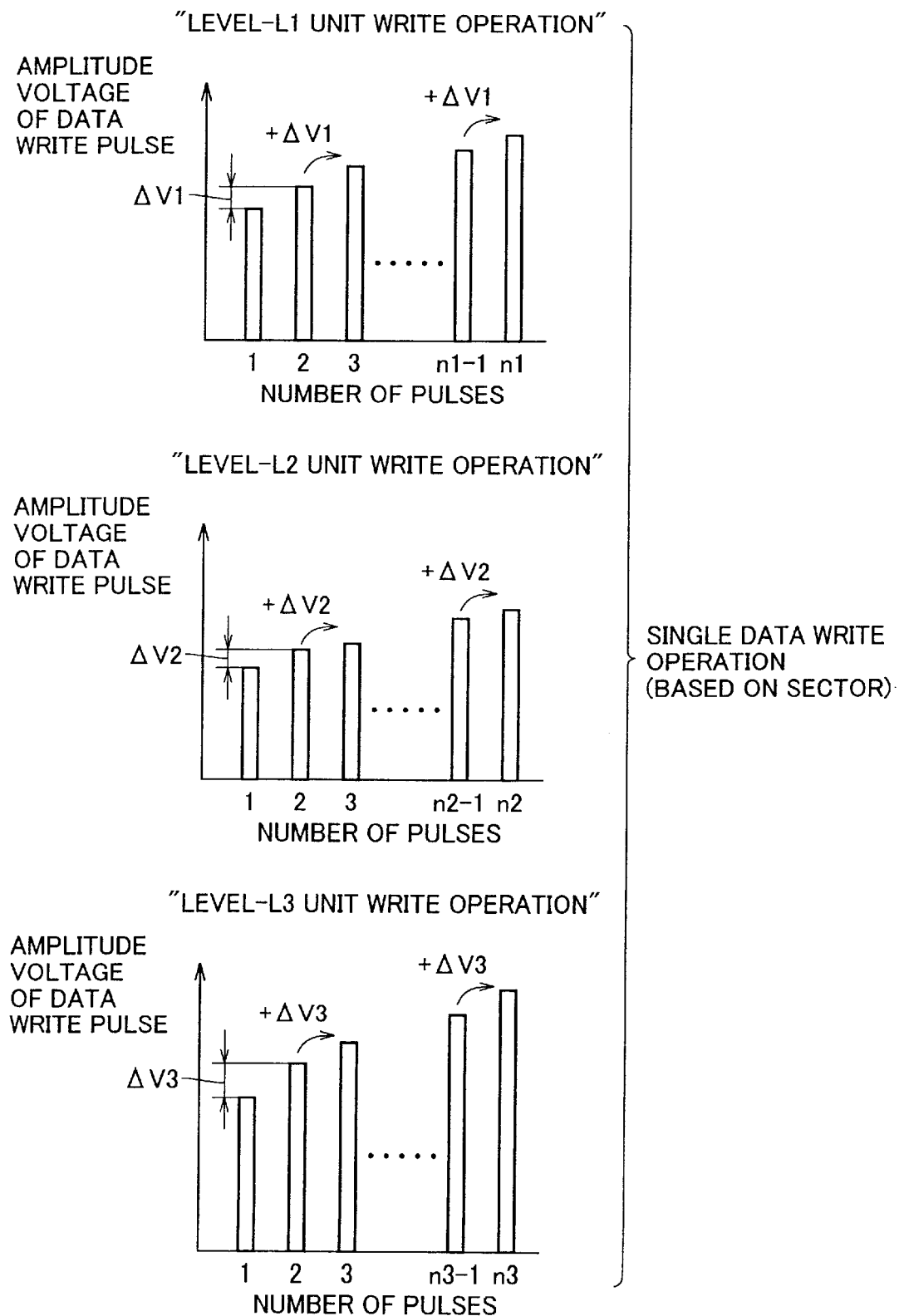
FIG. 17 is a conceptual diagram illustrating setting of an amplitude voltage of a data write pulse in a single data write operation according to a second modification of the third embodiment.

FIG. 17 is a conceptual diagram illustrating setting of the voltage amplitude of the data write pulse in a single data write operation according to the second modification of the third embodiment.

Referring to FIG. 17, in the level-L1 unit write operation, the data write pulse is applied n1 times in total according to the verify operation, until data t of level L1 is written normally (where n1 is a natural number). In the second modification of the third embodiment, the voltage amplitude of the data write pulse is increased by a prescribed amount $\Delta V1$ upon every application of the data write pulse.

Similarly, in the level-L2 unit write operation, the data write pulse is applied n2 times in total (where n2 is a natural number), and the voltage amplitude thereof is increased by a prescribed amount $\Delta V2$ upon every application of the data write pulse. In the level-L3 unit write operation as well, the data write pulse is applied n3 times in total (where n3 is a natural number), and the voltage amplitude thereof is increased by a prescribed amount $\Delta V3$ upon every application of the data write pulse.

The control circuit according to the second modification of the third embodiment sets the prescribed voltages $\Delta V2$ and $\Delta V3$ of the subsequent level-L2 and L3 unit write operations, based on the calculated number of pulse applications NL1 stored in the register 420.

Note that, except for the operation of the control circuit, the structure and operation of the flash memory of the second modification of the third embodiment is the same as those of the third embodiment shown in FIG. 11. Therefore, detailed description thereof will not be repeated.

Figures 18, 19:
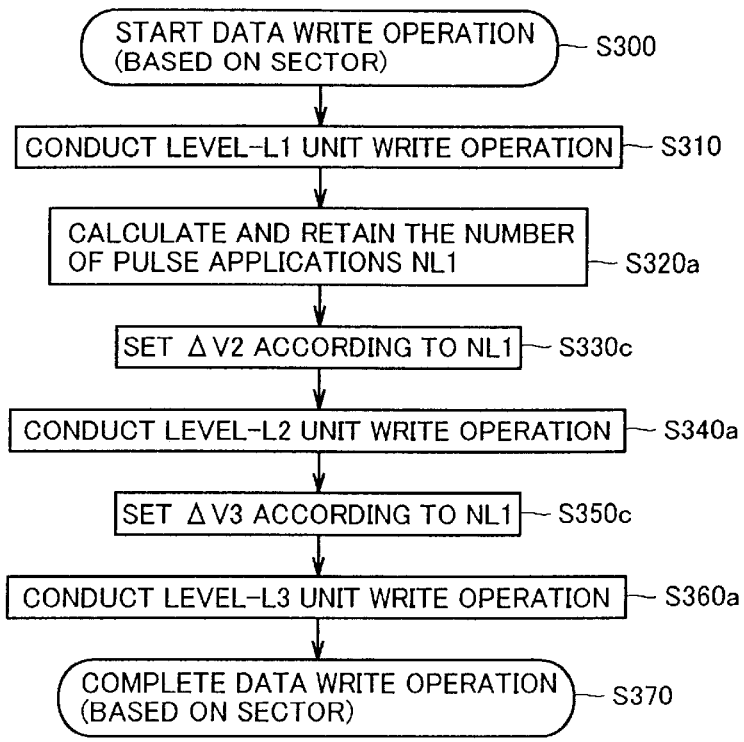
FIG. 18 is a flowchart illustrating the operation of a control circuit according to the second modification of the third embodiment.
FIG. 19 is a diagram illustrating setting of the data write conditions according to the second modification of the third embodiment.

Referring to FIG. 18, the process flow of the control circuit according to the second modification of the third embodiment is different from that of the control circuit of the third embodiment shown in FIG. 13 in that steps S330a and S350a are replaced with step S330c and S350c.

The control circuit according to the second modification of the third embodiment sets the prescribed voltages $\Delta V2$ and $\Delta V3$ according to the calculated number of pulse applications NL1 in steps S330c and S350c, respectively, and transmits the voltages $\Delta V2$ and $\Delta V3$ to the high-voltage generating circuit 80n.

The high-voltage generating circuit 80n increases the program voltages Vpgm1, Vpgm2 and Vpgm3 by the prescribed amounts $\Delta V1$, $\Delta V2$ and $\Delta V3$ according to the process corresponding to steps S154, S164 and S174 of FIG. 5, respectively. When it is determined in steps S158, S168 and S178 of FIG. 5 that the unit write operation has failed to be conducted normally (Fail), steps S154 to S156, S164 to S166 and S174 to S176 are repeatedly conducted, respectively.

Since the process flow of the control circuit is otherwise the same as that of the third embodiment, detailed description thereof will not be repeated.

Referring to FIG. 19, in the second modification of the third embodiment as well, the data write characteristics of the sector selected for the data write operation are determined based on the calculated number of pulse applications NL1 in that sector.

Accordingly, when the calculated number of pulse applications NL1 is within a normal range, the write condition information PD is set to "00", and the prescribed voltages $\Delta V2$ and $\Delta V3$ are respectively set to the standard values $\Delta V2s$ and $\Delta V3s$.

When the calculated number of pulse applications NL1 is larger than the normal range, the write condition information PD is set to "01", and the prescribed voltages $\Delta V2$ and $\Delta V3$ are respectively set to the values $\Delta V2h$ and $\Delta V3h$ that are larger than the standard values. When the calculated number of pulse applications NL1 is smaller than the normal range, the write condition information PD is set to "10", and the prescribed voltages $\Delta V2$ and $\Delta V3$ are respectively set to the values $\Delta V2l$ and $\Delta V3l$ that are smaller than the standard values.

This allows an appropriate data write operation to be conducted on a sector-by-sector basis in view of variation in memory cell characteristics resulting from the manufacturing variation, as in the case of the third embodiment.

Instead of the prescribed voltages $\Delta V2$ and $\Delta V3$, or in combination with the prescribed voltages $\Delta V2$ and $\Delta V3$, the respective initial values of the program voltages Vpgm2 and Vpgm3 can be set in a stepwise manner. Alternatively, the prescribed voltages $\Delta V1$, $\Delta V2$ and $\Delta V3$ may be set to a negative value so that the voltage amplitude of the data write pulse is reduced upon every application of the data write pulse.

Note that, in the third embodiment and modifications thereof described above, a single data write operation to each sector is conducted so that the data write conditions of the second and the following unit write operations are set according to the result of the first unit write operation. However, the data write characteristics of each sector may be determined from the factors other than the result of the first unit write operation. In other words, the data write characteristics of the sector of interest may alternatively be determined based on the result of any unit write operation other than the final unit write operation, so that the data write conditions of the following unit write operations are set according to this determination.

Fourth Embodiment

The fourth embodiment is described in terms of a structure for setting the data write conditions according to the result of the past data write operation to the sector.

Figure 20:
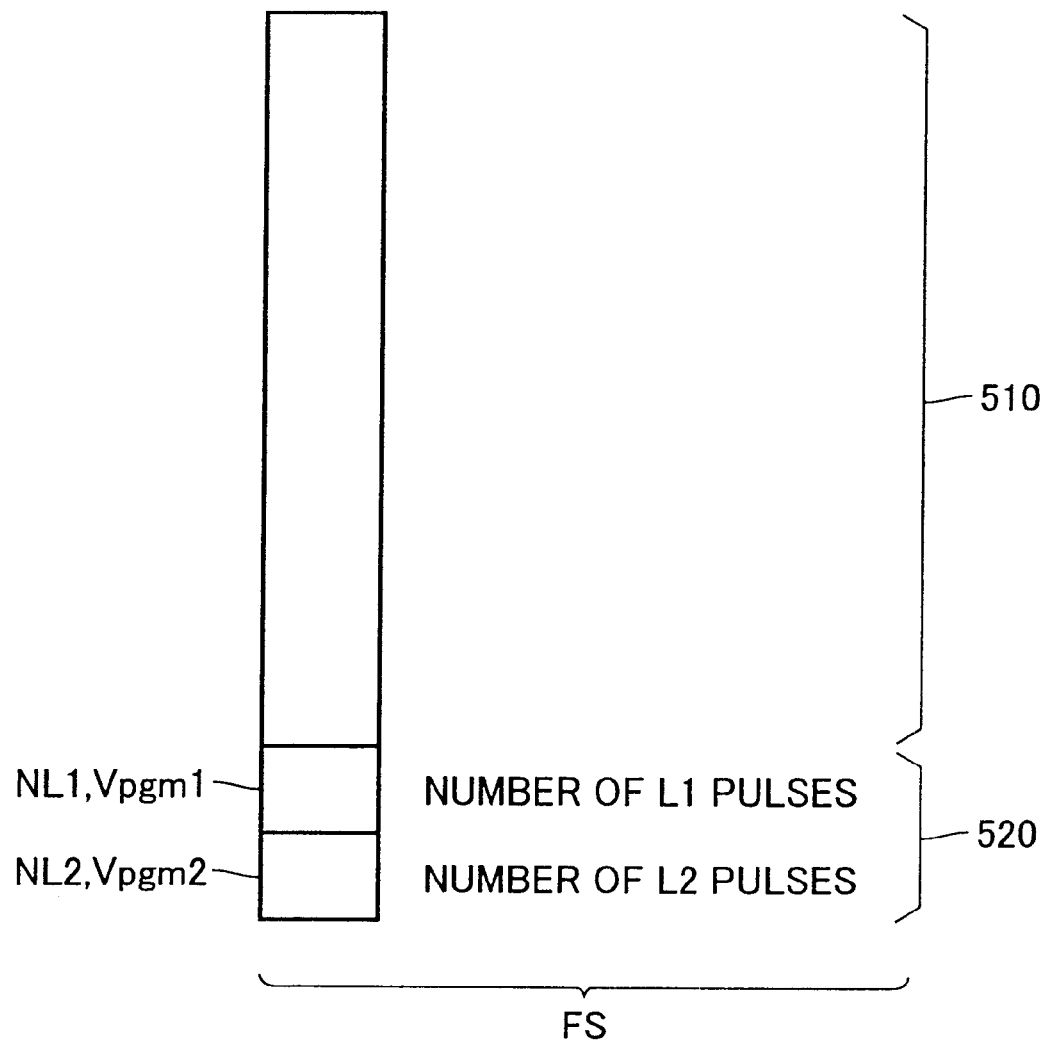
FIG. 20 is a conceptual diagram showing the structure of each sector in a normal memory array 10n according to a fourth embodiment of the present invention.

FIG. 20 shows the structure of each sector in the normal memory array 10n according to the fourth embodiment.

In FIG. 20, the sectors FS1 to FSm in the normal memory array 10n are generally referred to as FS.

Referring to FIG. 20, according to the fourth embodiment, the sector FS has a data storage region 510 including a memory cell group for normal data storage, and a management region 520 for storing the result of the past data write operations.

The management region 520 stores the calculated number of pulse applications NL1, NL2 and the program voltages Vpgm1, Vpgm2 corresponding to the amplitude voltage of the data write pulse in the level-L1 and L2 unit data write operations of the previous data write operation to the sector. Alternatively, the management region 520 may store the write condition information PD that was set according to the calculated number of pulse applications NL1, NL2 and the program voltages Vpgm1, Vpgm2.

Note that, except for the sector structure and the operation of the control circuit, the structure and operation of the flash memory of the fourth embodiment is the same as those of the third embodiment shown in FIG. 11. Therefore, detailed description thereof will not be repeated.

Figure 21:
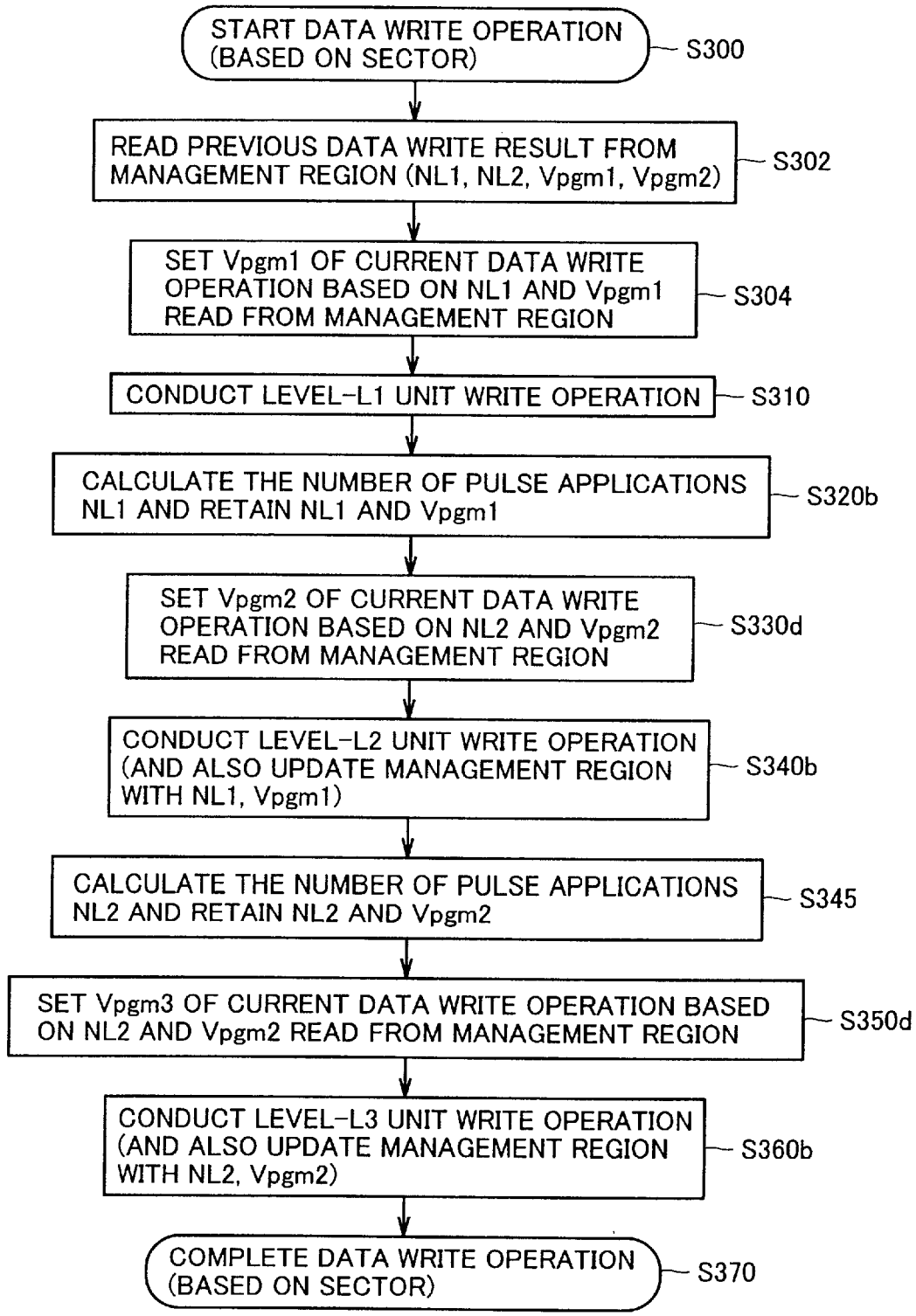
FIG. 21 is a flowchart illustrating the operation of a control circuit according to the fourth embodiment.

FIG. 21 is a flowchart illustrating the operation of the control circuit according to the fourth embodiment.

Referring to FIG. 21, when a single data write operation to a sector is started in response to a write command input to the normal memory array 10n (step S300), the result of the previous data write operation is read from the management region 520 of the selected sector. In other words, the calculated number of pulse applications NL1, NL2 and the program voltages Vpgm1, Vpgm2 in the previous data write operation, or the write condition information PD that was set according to the calculated number of pulse applications NL1, NL2 and the program voltages Vpgm2, Vpgm3, are read (step S302).

The control circuit of the fourth embodiment determines the prescribed setting conditions of the level-L1 unit write operation of the current data write operation, such as the program voltage Vpgm1 corresponding to the amplitude voltage of the data write pulse, according to the calculated number of pulse applications NL1 and the program voltage Vpgm1 (or the corresponding write condition information PD) that are read from the management region 520 (step S304).

The high-voltage generating circuit 80n produces the program voltages Vpgm1 to Vpgm3 in the respective steps of the process flow shown in FIG. 21, according to the instruction from the control circuit.

The data write pulse according to the conditions determined in step S304 is applied in order to conduct the level-L1 unit write operation (step S310). Since the process of step S310 has already been described in connection with FIG. 13, detailed description thereof will not be repeated.

When the level-L1 unit write operation is completed normally, the control circuit calculates the number of pulse applications conducted according to the write verify operation, and retains the calculated number of pulse applications NL1 and the program voltage Vpgm1 in the register 420.

The control circuit determines the prescribed setting conditions of the level-L2 unit write operation of the current data write operation (e.g., the program voltage Vpgm2 corresponding to the amplitude voltage of the data write pulse) according to the calculated number of pulse applications NL2 and the program voltage Vpgm2 (or the corresponding write condition information PD) that are read from the management region 520 (step S330d).

The data write pulse according to the conditions determined in step S330d is applied in order to conduct the level-L2 unit write operation (step S340b). In step S340b, in parallel with the process corresponding to step S340a of FIG. 13, the management region 520 is updated with the result of the current level-L1 unit write operation, i.e., the calculated number of pulse applications NL1 and the program voltage Vpgm1 (or the corresponding write condition information PD).

When the level-L2 unit write operation is completed normally, the control circuit calculates the number of pulse applications conducted according to the write verify operation, and retains the calculated number of pulse applications NL2 and the program voltage Vpgm2 of the current data write operation in the register 420 (step S345).

Then, the control circuit determines the prescribed setting conditions of the level-L3 unit write operation of the current data write operation (e.g., the program voltage Vpgm3 corresponding to the amplitude voltage of the data write pulse) according to the calculated number of pulse applications NL2 and the program voltage Vpgm2 (or the corresponding write condition information PD) that are read from the management region 520 (step S350d).

The data write pulse according to the conditions determined in step S350d is applied in order to conduct the level-L3 unit write operation (step S360b). In step S360b, in parallel with the process corresponding to step S360a of FIG. 13, the management region 520 is updated with the result of the current level-L2 unit write operation, i.e., the calculated number of pulse applications NL2 and the program voltage Vpgm2 (or the corresponding write condition information PD).

Thus, the level-L1 to L3 unit write operations are each conducted using the data write pulse determined according to the result of the previous data write operation. Moreover, the management region 520 is updated with the result of the current data write operation (the calculated number of pulse applications and the program voltage) for use in setting the data write conditions of the subsequent data write operation.

Moreover, the result of the final unit write operation is not stored in the management region 520. This enables the result of each unit write operation to be applied to the normal memory array 10n simultaneously with the normal write data from the external I/O, in the subsequent unit write operation within the same write operation. As a result, the result can be written to the management region without increasing the processing time of the data write operation.

Accordingly, optimal data write conditions, i.e., conditions of the data write pulse, can be set on a sector-by-sector basis in the data write operation. This enables suppression of variation in data write time between the sectors as well as variation in threshold voltage distribution in the data write state.

Moreover, according to the fourth embodiment, the conditions of the data write pulse in the level-L1 unit write operation can also be set optimally, as compared to the case of the third embodiment, whereby the data write conditions of each sector can be set in a more appropriate manner.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A non-volatile semiconductor memory device, comprising:
    a first memory array for storing data in a non-volatile manner, said first memory array being divided into a plurality of first unit regions each corresponding to a unit subjected to a single prescribed operation one of writing and erasing data;
    an operation condition storage portion for retaining setting condition data of the prescribed operation to said first memory array, said operation condition storage portion including a second memory array including a plurality of second unit regions each corresponding to a unit subjected to a single data read operation, each of said second unit regions storing the setting condition data corresponding to one of said plurality of first unit regions in a non-volatile manner;
    an electric signal control portion for determining, based on the setting condition data read from said operation condition storage portion, a setting condition of an electric signal for conducting said prescribed operation to a selected one of said plurality of first unit regions; and
    a selecting portion for supplying to the selected one of said first unit regions said electric signal according to the setting condition determined by said electric signal control portion.

2. The non-volatile semiconductor memory device according to claim 1, wherein said plurality of second unit regions are provided respectively corresponding to said plurality of first unit regions, and said operation condition storage portion further includes a read control portion for reading, in said prescribed operation, the setting condition data from one of said plurality of second unit regions that corresponds to the selected one of said first unit regions.

3. The non-volatile semiconductor memory device according to claim 1, wherein
    said operation condition storage portion further includes
        an address storage portion for storing a plurality of designation addresses respectively corresponding to pre-designated first unit regions of said plurality of first unit regions, and
        an address match comparison portion for comparing, in said prescribed operation, an input address indicating the selected one of said first unit regions with any one of said designation addresses so as to check if they match each other,
    said plurality of second unit regions are provided respectively corresponding to said designation addresses,
    said operation condition storage portion further includes an initializing portion for resetting the setting condition data to a prescribed value corresponding to a standard setting condition of said electric signal, when said input address does not match each of said plurality of designation addresses, and
    a read control portion for reading the setting condition data from one of said plurality of second unit regions that corresponds to the matched designation address, when said input address matches one of said plurality of designation addresses, and
    each of said second unit regions stores the setting condition data different from said prescribed value.

4. The non-volatile semiconductor memory device according to claim 3, wherein said address storage portion includes a program element for storing said plurality of designation addresses in a non-volatile, irreversible manner.

5. The non-volatile semiconductor memory device according to claim 3, wherein said address storage portion includes a storage element for storing said plurality of designation addresses in a non-volatile manner, and said storage element is electrically rewritable.

6. The non-volatile semiconductor memory device according to claim 1, wherein said electric signal is a pulsed voltage signal having a voltage amplitude and a pulse width as said setting condition, and said setting condition data includes information for setting said voltage amplitude in said prescribed operation.

7. The non-volatile semiconductor memory device according to claim 1, wherein the prescribed operation is the operation for writing the data.

8. The non-volatile semiconductor memory device according to claim 1, wherein the prescribed operation is the operation for erasing the data.

9. A non-volatile semiconductor memory device, comprising:
    a memory array including a plurality of memory cells each being capable of storing a plurality of data levels in a non-volatile manner, said memory array being divided into a plurality of unit regions each corresponding to a unit subjected to a single data write operation;
    an electric signal control portion for determining a setting condition of a plurality of electric signals for conducting a plurality of unit write operations corresponding to said plurality of data levels, respectively, said plurality of unit write operations forming said single data write operation, and said electric signal control portion setting the setting condition of each of the unit write operations except for an initial unit write operation thereof, according to a result of at least one of the unit write operations that have already been conducted in the same data write operation; and
    a selecting portion for supplying, in said plurality of unit write operations, said plurality of electric signals according to the setting condition determined by said electric signal control portion to a selected one of said plurality of unit regions.

10. The non-volatile semiconductor memory device according to claim 9, wherein said electric signal is a pulsed voltage signal, and said setting condition designates a voltage amplitude of said electric signal.

11. The non-volatile semiconductor memory device according to claim 9, wherein said electric signal is a pulsed voltage signal, and said setting condition designates a pulse width of said electric signal.

12. The non-volatile semiconductor memory device according to claim 9, wherein
    in each of said unit write operations, said electric signal control portion verifies whether a desired unit write operation has been conducted or not upon every application of said electric signal, and repeatedly applies said electric signal until said desired unit write operation is conducted, and said result indicates a number of applications of said electric signal applied until said desired unit write operation is conducted in said at least one of unit write operations.

13. The non-volatile semiconductor memory device according to claim 12, wherein said electric signal is a pulsed voltage signal, and in each of said unit write operations, said electric signal control portion varies a voltage amplitude of said electric signal upon every application of said electric signal by a prescribed amount according to said result.

14. The non-volatile semiconductor memory device according to claim 12, wherein said electric signal is a pulsed voltage signal, and in each of said unit write operations, said electric signal control portion varies a pulse width of said electric signal upon every application of said electric signal by a prescribed power according to said result.

15. The non-volatile semiconductor memory device according to claim 9, wherein each of said unit regions include a management data region for storing the result of the data write operation conducted previously, and said electric signal control portion further determines the setting condition of the initial one of said plurality of unit write operations, based on the result read from the management region.

16. The non-volatile semiconductor memory device according to claim 15, wherein said electric signal control portion instructs to write the result of each of the unit write operations except for a final one of said plurality of unit write operations, during a subsequent unit write operation of the same data write operation.

17. A non-volatile semiconductor memory device, comprising:

a memory array including a plurality of memory cells each being capable of storing a plurality of data levels in a non-volatile manner, said memory array being divided into a plurality of unit regions each corresponding to a unit subjected to a single data write operation, each of said unit regions including a management data region for storing a result of the data write operation conducted previously;

an electric signal control portion for determining based on the result read from the management region, a setting condition of a plurality of electric signals for conducting a plurality of unit write operations corresponding to said plurality of data levels, respectively, said plurality of unit write operations forming said single data write operation; and a selecting portion for supplying, in said plurality of unit write operations, said plurality of electric signals according to the setting condition determined by said electric signal control portion to a selected one of said plurality of unit regions.

18. The non-volatile semiconductor memory device according to claim 17, wherein said electric signal control portion instructs to write the result of each of the unit write operations except for a final one of said plurality of unit write operation, during a subsequent unit write operation of the same data write operation.

* * * * *